(12) United States Patent
Togo

(10) Patent No.: US 6,295,620 B1
(45) Date of Patent: Sep. 25, 2001

(54) MEMORY TEST FACILITATION CIRCUIT USING STORED TEST DATA REPEATEDLY

(75) Inventor: Kiyotake Togo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/291,063

(22) Filed: Apr. 14, 1999

(30) Foreign Application Priority Data

Apr. 22, 1998 (JP) .................................................. 10-111855

(51) Int. Cl.[7] ............................ G11C 29/00; G01R 31/28
(52) U.S. Cl. ............................................ 714/719; 714/724
(58) Field of Search ..................................... 714/718, 719

(56) References Cited

U.S. PATENT DOCUMENTS

| | | | |
|---|---|---|---|
| 5,289,475 | * | 2/1994 | Slemmer ................. 714/718 |
| 5,396,499 | * | 3/1995 | Urai ....................... 714/718 |
| 5,428,575 | * | 6/1995 | Fudeyasu ................ 365/201 |
| 5,619,461 | * | 4/1997 | Roohparvar ............. 365/201 |
| 5,677,885 | * | 10/1997 | Roohparvar ............. 365/201 |
| 5,757,809 | * | 5/1998 | Kiso et al. .............. 714/718 |
| 5,825,783 | * | 10/1998 | Momohara ............... 714/718 |
| 5,956,349 | * | 9/1999 | Watanabe et al. ........ 714/718 |
| 6,154,860 | * | 11/2000 | Wright et al. ............ 714/718 |
| 6,158,028 | * | 12/2000 | Imura ..................... 714/718 |
| 6,158,036 | * | 12/2000 | Kwak ..................... 714/733 |

* cited by examiner

Primary Examiner—Albert Decady
Assistant Examiner—Joseph D. Torres
(74) Attorney, Agent, or Firm—Venable; Michael A. Sartori; Jeffrey W. Gluck

(57) ABSTRACT

A memory device has a main memory circuit, an auxiliary memory circuit for storing test data, and an interface circuit for transferring test data between the auxiliary memory circuit and external test equipment. Test data are transferred from the external test equipment to the auxiliary memory circuit, then transferred repeatedly to different locations in the main memory circuit. Different test patterns are generated by selectively inverting one bit, or all bits, in the test data as the data are transferred into the main memory circuit. Test results are obtained by using a comparator in the memory device to compare the data stored in the auxiliary memory circuit with data read from the main memory circuit.

17 Claims, 20 Drawing Sheets

CONVENTIONAL ART

CONVERTIONAL ART

US 6,295,620 B1

MEMORY TEST FACILITATION CIRCUIT USING STORED TEST DATA REPEATEDLY

BACKGROUND OF THE INVENTION

The present invention relates to a test facilitation circuit built into a memory device such as a dynamic random-access memory.

A dynamic random-access memory (DRAM) is tested by writing various test data patterns into its memory-cell array, then reading the written data. A test facilitation circuit speeds up the testing process by providing a high-speed synchronous interface between the memory device and external test equipment, and an auxiliary memory circuit for temporary storage of the test data within the memory device. The auxiliary memory circuit has a capacity equal to, for example, one row of memory cells in the memory-cell array.

In a conventional test facilitation circuit, test data are transferred into the auxiliary memory circuit until the auxiliary memory circuit is full, then written all at once into the memory-cell array. To write a test pattern into the memory-cell array, this two-step process is repeated for every row of memory cells, for example, so despite the high-speed synchronous interface, much time is consumed in the transfer of data from the test equipment to the auxiliary memory circuit. Further details will be given below.

SUMMARY OF THE INVENTION

It is accordingly an object of the present invention to speed up the testing of memory devices.

The invented test facilitation circuit is integrated into a memory device having a main memory circuit with a plurality of memory cells. The test facilitation circuit comprises an auxiliary memory circuit storing test data, an internal data bus coupling the auxiliary memory circuit to the main memory circuit, an interface circuit communicating with external test equipment, an auxiliary memory controller controlling the auxiliary memory circuit, and a main memory controller.

The main memory controller receives a test mode signal from the external test equipment. When the test mode signal is in one state, the main memory controller responds to a write request signal from the external test equipment by directing the auxiliary memory controller to transfer test data from the interface circuit to the auxiliary memory circuit, then by transferring the test data from the auxiliary memory circuit to the main memory circuit. When the test mode signal is in another state, the main memory controller responds to the write request signal by transferring test data immediately from the auxiliary memory circuit to the main memory circuit.

The invented method of testing a memory circuit comprises the steps of transferring test data from the external test equipment to the auxiliary memory circuit, storing the test data in the auxiliary memory circuit, and repeatedly transferring the test data from the auxiliary memory circuit to different locations in the main memory circuit.

DETAILED DESCRIPTION OF THE INVENTION

Embodiments of the invention will be described with reference to the attached illustrative drawings, following a more detailed description of a conventional test facilitation circuit.

Figure 1:
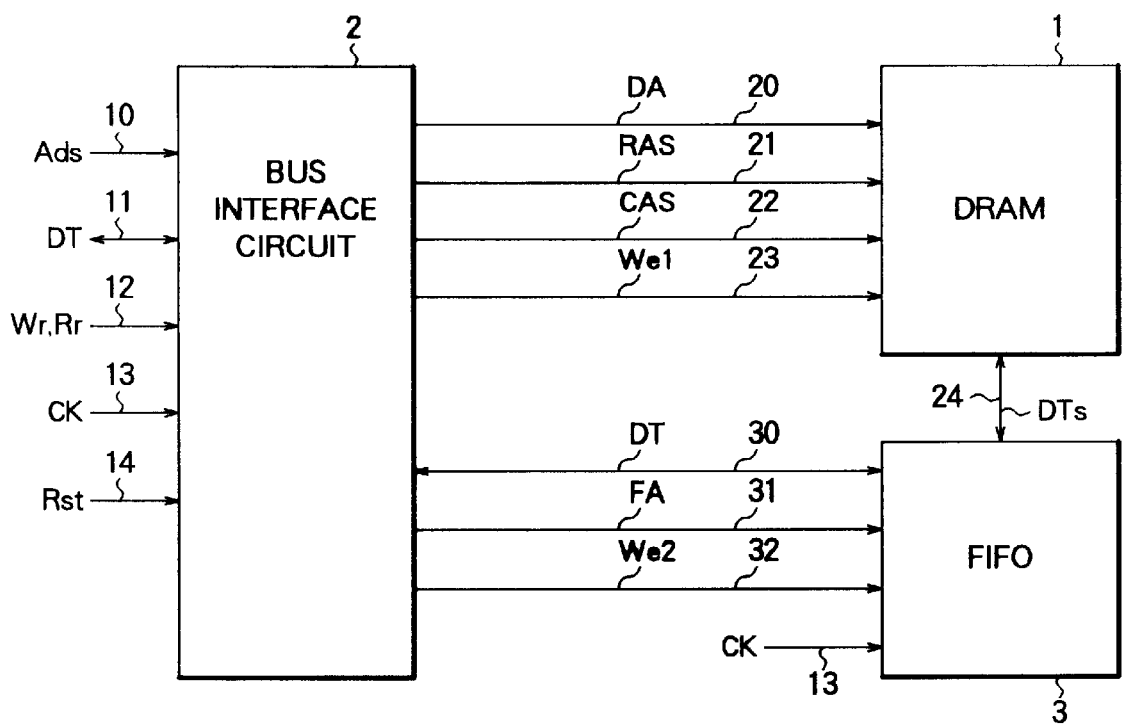
FIG. 1 is a block diagram of a memory device with a conventional test facilitation circuit.

FIG. 1 illustrates a memory device having a main memory circuit or DRAM 1, a bus interface circuit 2, and an auxiliary memory circuit or FIFO 3. The DRAM 1 is a row-column array of dynamic memory cells with associated sense amplifiers, address decoders, and other well-known circuit elements. The bus interface circuit 2 and FIFO 3 constitute the conventional test facilitation circuit. The FIFO 3 has a capacity of n words, where n is a positive integer and each word comprises thirty-two bits. The capacity of the FIFO 3 (32×n bits) is equal to, for example, the length of one row of memory cells in the DRAM 1.

As an external interface, the bus interface circuit 2 has an external data bus 10 for receiving external address information Ads, an external data bus 11 thirty-two bits wide for input and output of data DT, a control bus 12 for receiving bus commands such as a write request signal Wr and a read request signal Rr, a clock signal line 13 for receiving a clock signal CK, and a reset signal line 14 for receiving a reset signal Rst.

As an internal interface with the DRAM 1, the bus interface circuit 2 has an internal address bus 20 for address signals DA, a row address strobe signal line 21 for a row address strobe signal RAS, a column address strobe signal line 22 for a column address strobe signal CAS, and a write enable signal line 23 for a first write enable signal We1. These signals (DA, RAS, CAS, We1) are sent from the bus interface circuit 2 to the DRAM 1.

The DRAM 1 is coupled to the FIFO 3 by a bidirectional internal data bus 24 with a width of 32×n bits, matching the storage capacity of the FIFO 3.

As an internal interface with the FIFO 3, the bus interface circuit 2 has a bidirectional internal data bus 30 thirty-two bits wide for transfer of data DT, an internal address bus 31 for a FIFO address FA, and a write enable signal line 32 for a second write enable signal We2. The FA and We2 signals are sent from the bus interface circuit 2 to the FIFO 3. The FIFO 3 also receives the clock signal CK from the clock signal line 13.

Incidentally, FIFO stands for first-in-first-out. Although FIFO is often used as the generic name of a type of memory that functions like a first-in-first-out queue, the term FIFO is used in a more general sense herein, denoting a memory that is used to transfer data from one data bus to another data bus.

Figure 2:
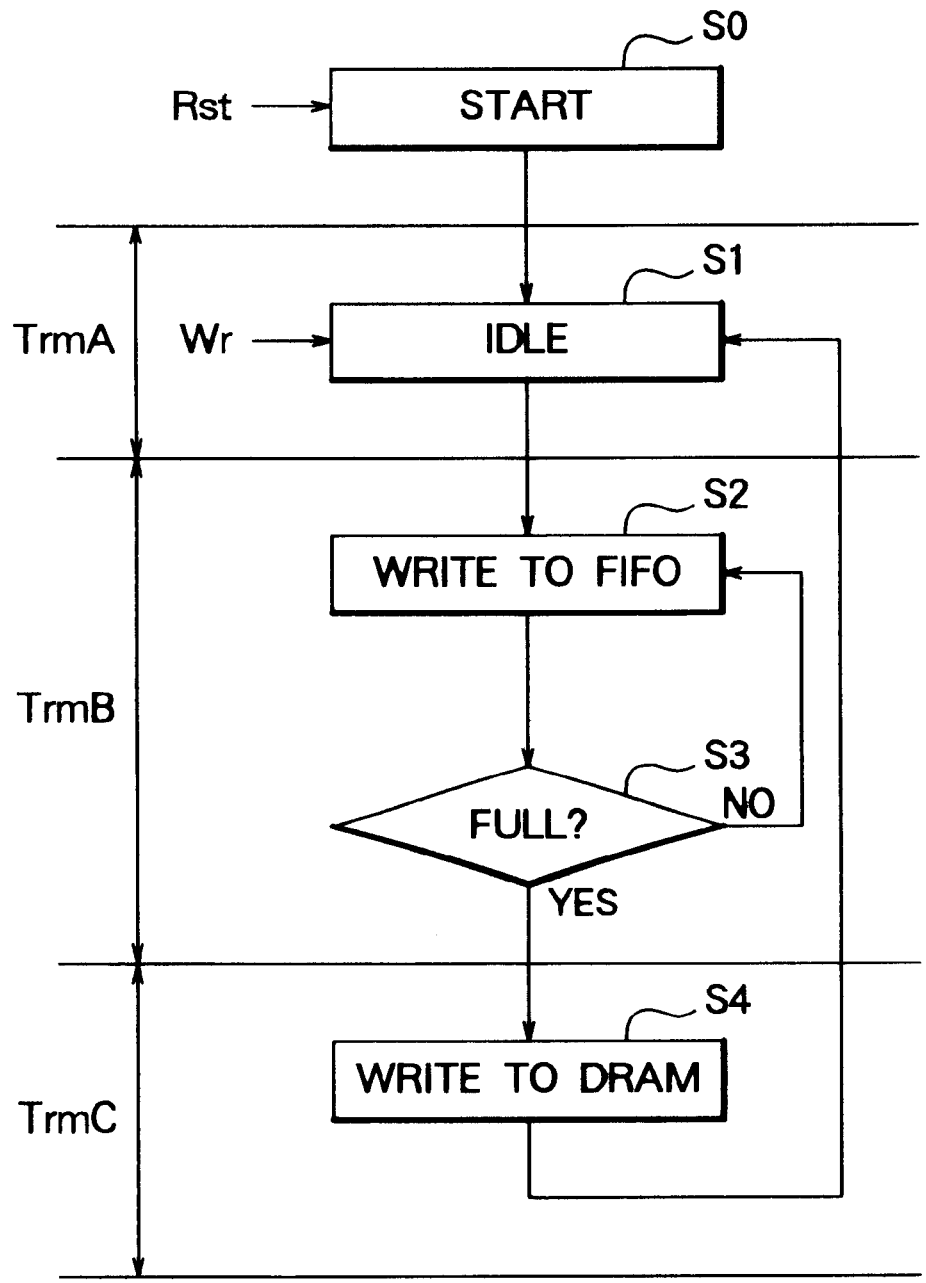
FIG. 2 is a flowchart illustrating the operation of the conventional test facilitation circuit.

Referring to FIG. 2, to write test data in the DRAM 1, external test equipment (not visible) starts by activating, then deactivating the reset signal Rst, thereby first resetting the test facilitation circuit, then releasing the test facilitation circuit from the reset state (step S0). From the reset state, the test facilitation circuit enters an idle state (step S1). The test equipment then sends a write request Wr to the bus interface circuit 2, and writes test data, thirty-two bits at a time, through the bus interface circuit 2 into the FIFO 3 (step S2), continuing until the FIFO 3 is full (step S3). The bus interface circuit 2 now sends control signals to the DRAM 1, causing the entire contents of the FIFO 3 to be transferred all at once into the DRAM 1 and stored therein (step S4). The test facilitation circuit then returns to the idle state (step S1) to await the next request from the test equipment.

Each write operation requires three periods of elapsed time, including a period TrmA in the idle state, a comparatively long period TrmB for transferring the test data to the FIFO 3, and a shorter period TrmC for transferring the test data from the FIFO 3 to the DRAM 1.

Figure 3:
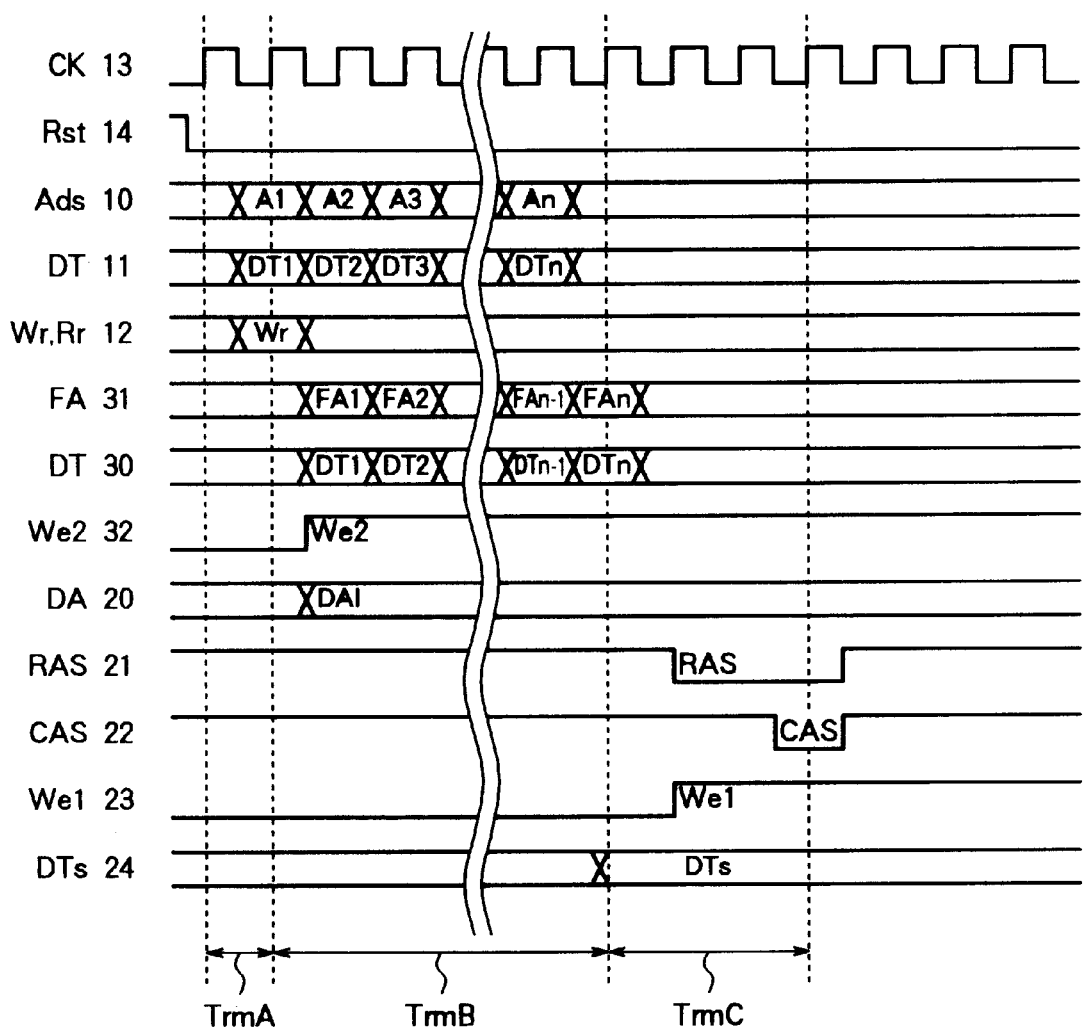
FIG. 3 is a timing diagram illustrating the operation of the conventional test facilitation circuit.

FIG. 3 illustrates the signals sent during these three periods, identifying each signal by its abbreviated name and the reference numeral of the signal line or bus in FIG. 1. The operations are synchronized with the clock signal CK on the clock signal line 13. Addresses, data, and other signals are output in synchronization with falling transitions of the clock signal, and read in synchronization with rising transitions of the clock signal.

The idle period TrmA begins when the inactive reset signal Rst is first recognized at a rising transition of the clock signal CK, and ends when the write request Wr is recognized at the next rising transition of CK. Together with the write request Wr, the external test equipment supplies the first thirty-two bits of data DT1 and an external address A1. Subsequent addresses A2 to An and data DT2 to DTn are sent in subsequent clock cycles during period TrmB.

At the first falling clock transition in period TrmB, the bus interface circuit 2 activates the second write enable signal We2 (We2 goes high). During the following clock cycle, the bus interface circuit 2 sends the first thirty-two data bits DT1 to the FIFO 3, together with an address FA1 comprising the low-order bits of the external address A1. The FIFO 3 stores the data DT1 at the designated address. The bus interface circuit 2 also begins sending the DRAM 1 an address DA1 comprising the high-order bits of the external address A1.

Subsequent data DT2 to DTn are stored in like manner in the FIFO 3 at addresses FA2 to FAn, which comprise the low-order bits of external addresses A2 to An. The storing of data in the FIFO 3 is completed in the n clock cycles constituting period TrmB. Output of all 32×n bits of data DTs from the FIFO 3 to the DRAM 1 begins in the next clock cycle, in period TrmC.

In the next clock cycle after that, the bus interface circuit 2 activates the row address strobe signal RAS and first write enable signal We1 (We1 is active high; RAS is active low). At this point, the DRAM 1 latches and decodes the address DA1. Two clock cycles later, the bus interface circuit 2 activates the column address strobe signal CAS (which is also active low), and the DRAM 1 stores all 32×n bits of data DTs in a location, such as a single row of memory cells, designated by address DA1.

Figure 4:
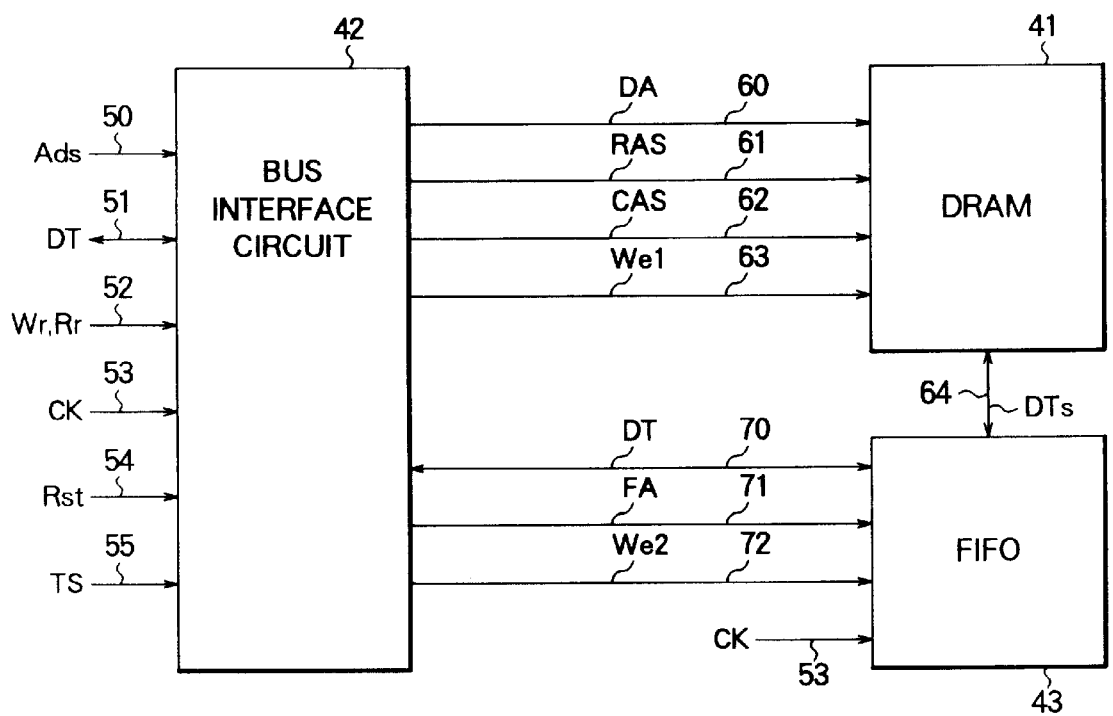
FIG. 4 is a block diagram of a memory device illustrating a first embodiment of the invention.

FIG. 4 illustrates a first embodiment of the invention, showing a main memory circuit or DRAM 41, a bus interface circuit 42, and an auxiliary memory circuit or FIFO 43. The DRAM 41 and FIFO 43 are similar to the conventional DRAM 1 and FIFO 3. The signals shown in FIG. 4 are similar to the conventional signals shown in FIG. 1, except for a novel test mode signal TS.

The bus interface circuit 42 has an external address bus 50, an external data bus 51, a control bus 52, a clock signal line 53, a reset signal line 54, and a test mode signal line 55 that receives the test signal TS. As an interface to the DRAM 41, the bus interface circuit 42 has an internal address bus 60, a RAS signal line 61, a CAS signal line 62, and a write enable (We1) signal line 63. The DRAM 41 and FIFO 43 are interconnected by a bidirectional data bus 64. As an interface to the FIFO 43, the bus interface circuit 42 has a bidirectional internal data bus 70, an address bus 71, and a write enable (We2) signal line 72. The FIFO 43 also receives the clock signal CK on signal line 53. Data buses 51 and 70 are thirty-two bits wide; data bus 64 is 32×n bits wide.

It will be assumed below that each row in the memory-cell array of the DRAM 41 has 32×n memory cells, and that the internal data bus 64 transfers data into or out of the DRAM 41 one row at a time.

Figure 5:
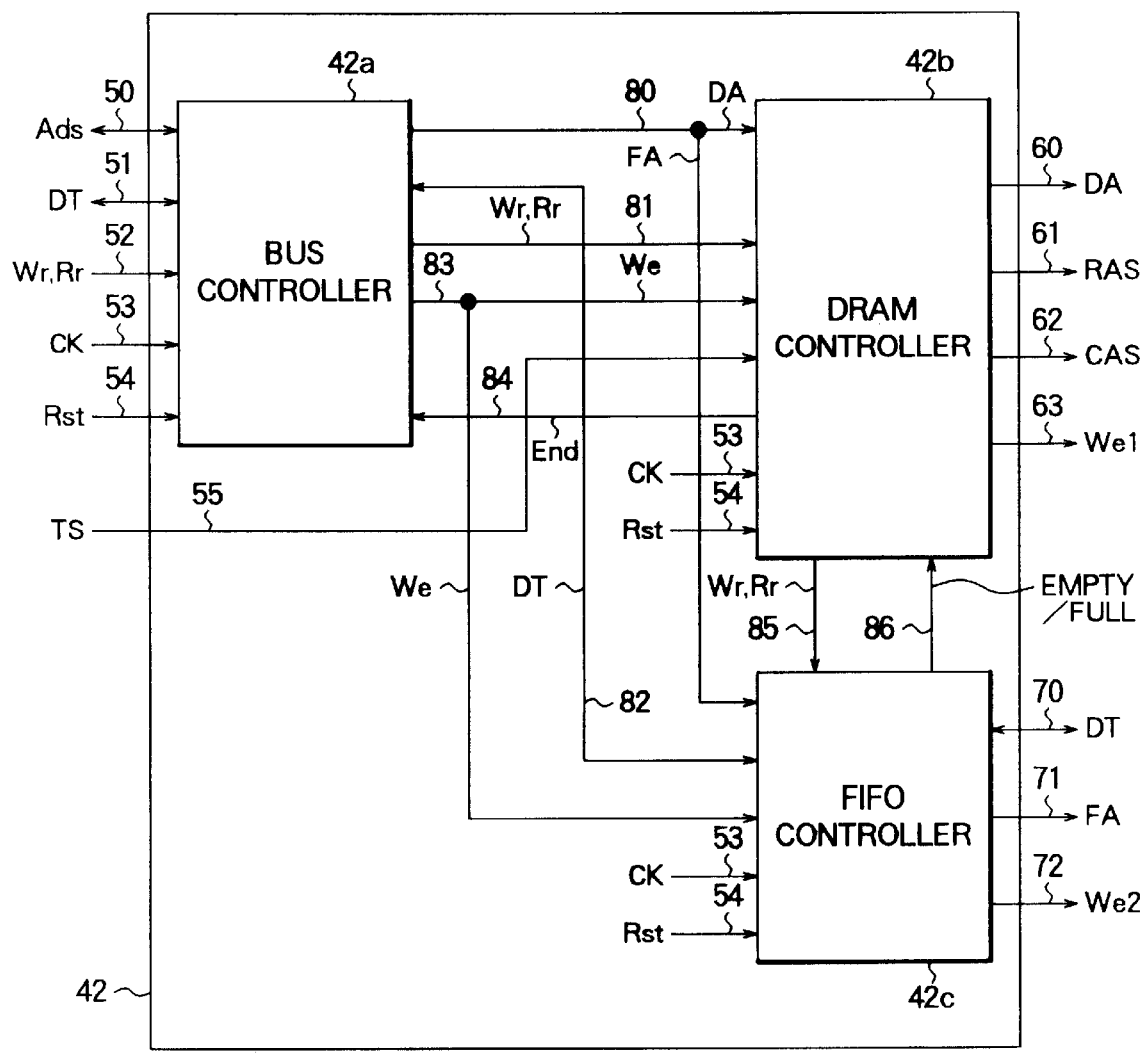
FIG. 5 is a more detailed block diagram of the bus interface circuit in FIG. 4.

Referring to FIG. 5, the bus interface circuit 42 comprises a bus controller 42a, to which the external address bus 50, data bus 51, control bus 52, clock signal line 53, and reset signal line 54 are connected; a DRAM controller 42b, to which the clock signal line 53, reset signal line 54, test mode signal line 55, internal address bus 60, RAS signal line 61, CAS signal line 62, and write enable signal line 63 are connected; and a FIFO controller 42c, to which the clock signal line 53, reset signal line 54, thirty-two bit internal data bus 70, address bus 71, and write enable signal line 72 are connected.

The bus controller 42a is coupled to the DRAM controller 42b and FIFO controller 42c by an internal address bus 80 that delivers the high-order address bits DA to the DRAM controller 42b, and the low-order address bits FA to the FIFO controller 42c. The bus controller 42a also has a signal line 81 for indicating read and write requests (Rr, Wr) to the DRAM controller 42b, a bidirectional internal data bus 82 for transferring data DT to and from the FIFO controller 42c, a signal line 83 for transferring a write enable signal (We) to the DRAM controller 42b and FIFO controller 42c, and a signal line 84 for receiving an end signal from the DRAM controller 42b. Signal line 81 is driven high for a write request and low for a read request.

The DRAM controller 42b has a signal line 85 for indicating read and write request signals (Rr, Wr) to the FIFO controller 42c, and a signal line 86 for receiving an empty/full signal from the FIFO controller 42c. Signal line 85 is driven high for a write request and low for a read request. Signal line 86 is driven high when the FIFO 43 is full, and low at other times.

Figure 6:
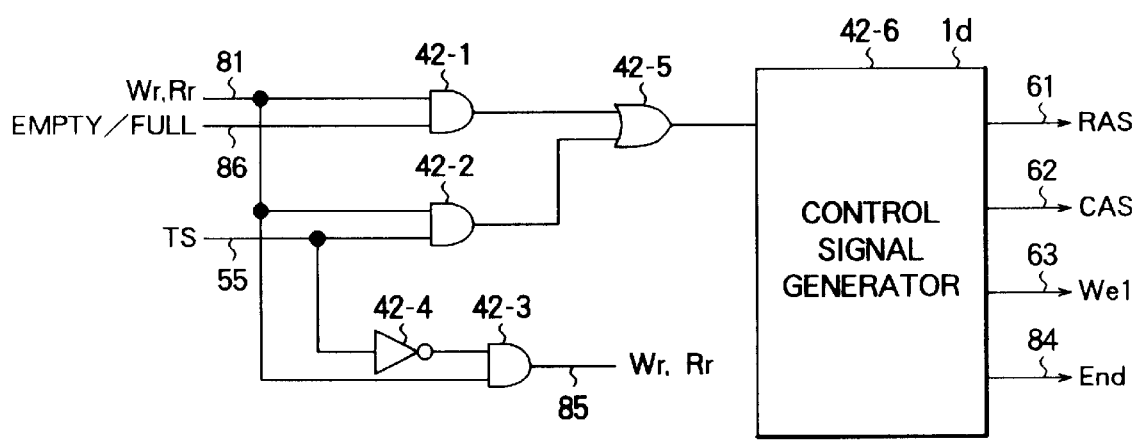
FIG. 6 is a more detailed block diagram of the DRAM controller in FIG. 5.

Referring to FIG. 6, the DRAM controller 42b comprises a first AND gate 42-1 with input terminals connected to signal lines 81 and 86, a second AND gate 42-2 with input terminals connected to signal lines 81 and 55, and a third AND gate 42-3 with input terminals connected to signal line 81 and the output terminal of an inverter 42-4 that inverts the test mode signal TS on signal line 55. The output terminal of the third AND gate 42-3 is connected to signal line 85, sending a read-write signal to the FIFO controller 42c. The output terminals of AND gates 42-1 and 42-2 are connected to an OR gate 42-5, the output terminal of which is connected to a control signal generator 42-6. The control signal generator 42-6 is coupled to signal lines 61, 62, 63, and 84, and generates the end signal and DRAM control signals RAS, CAS, and We1 in a fixed sequence when the output of OR gate 42-5 goes high.

Next, the operation of the first embodiment will be described.

Figure 7:
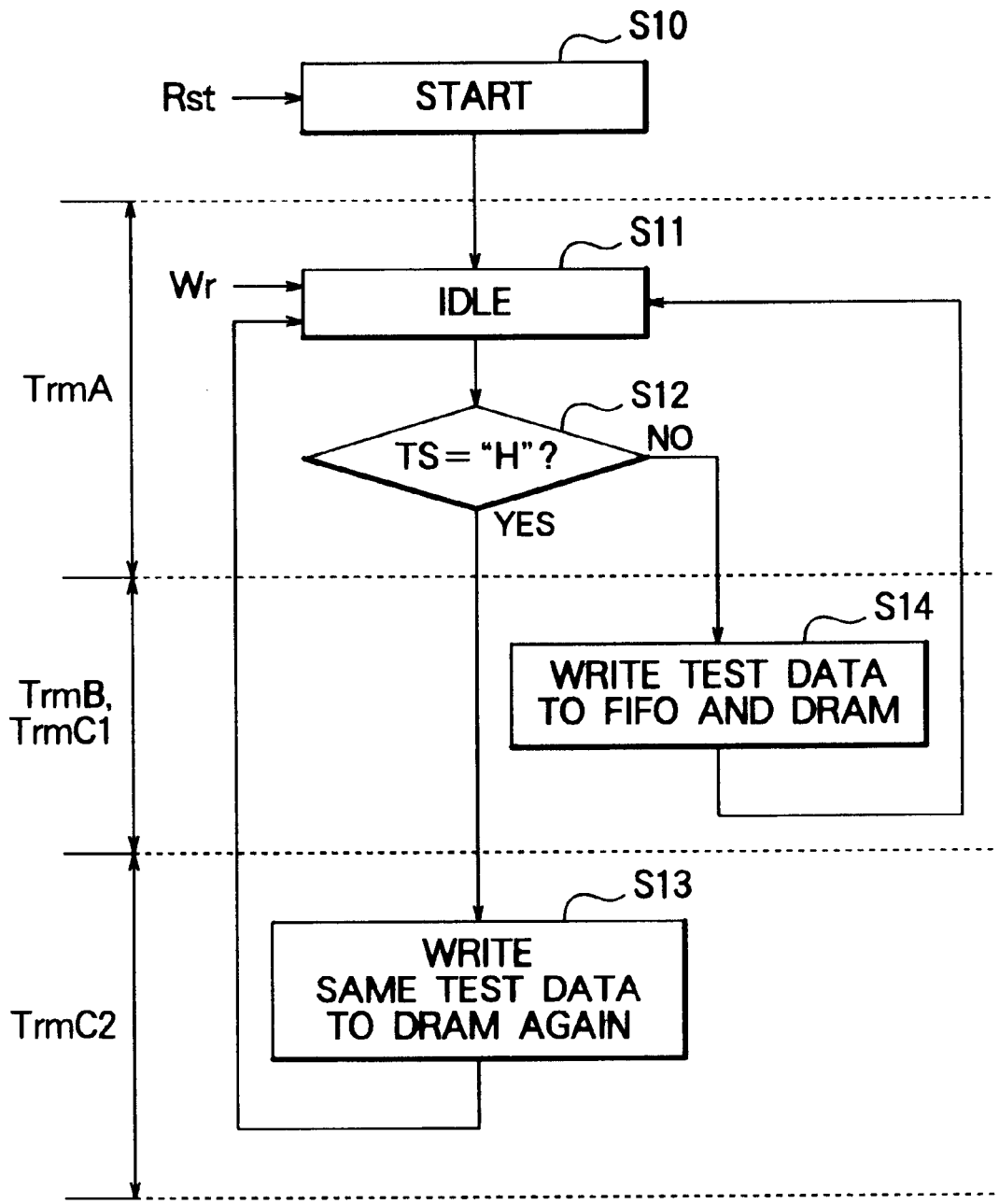
FIG. 7 is a flowchart illustrating the operation of the first embodiment.

Referring to FIG. 7, to write test data in the DRAM 41, external test equipment (not visible) starts by activating, then deactivating the reset signal, bringing the bus controller 42a, DRAM controller 42b, and FIFO controller 42c from the reset state (step S10) into the idle state (step S1). The external test equipment also places the test mode signal TS in the desired state and sends a write request signal, accompanied at least by an address. Subsequent action depends on whether the test mode signal TS is high or low (step S12). If the test mode signal TS is high ("H") the test facilitation circuit immediately transfers the contents of the FIFO 43 to the designated address in the DRAM 41 (step S13). If the test mode signal TS is low, the bus control circuit 42 receives new test data from the external test equipment, stores the new test data in the FIFO 43, then transfers the new test data from the FIFO 43 to the DRAM 41 (step 14), following the conventional procedure shown in FIG. 2 (steps S2 to S4). After step S13 or S14, the test facilitation circuit returns to the idle state (step S11) to await the next request from the external test equipment.

When the test mode signal TS is low, this procedure comprises a period TrmA in the idle state, a period TrmB for the transfer of test data to the FIFO 43, and a period TrmC1 for transfer of the test data from the FIFO 43 to the DRAM 41, so the elapsed time is the same as in the conventional procedure. When the test mode signal TS is high, however, the procedure comprises only a period TrmA in the idle state and a period TrmC2 for transfer of test data from the FIFO 43 to the DRAM 41, so the elapsed time is much shorter than in the conventional procedure.

Figure 8:
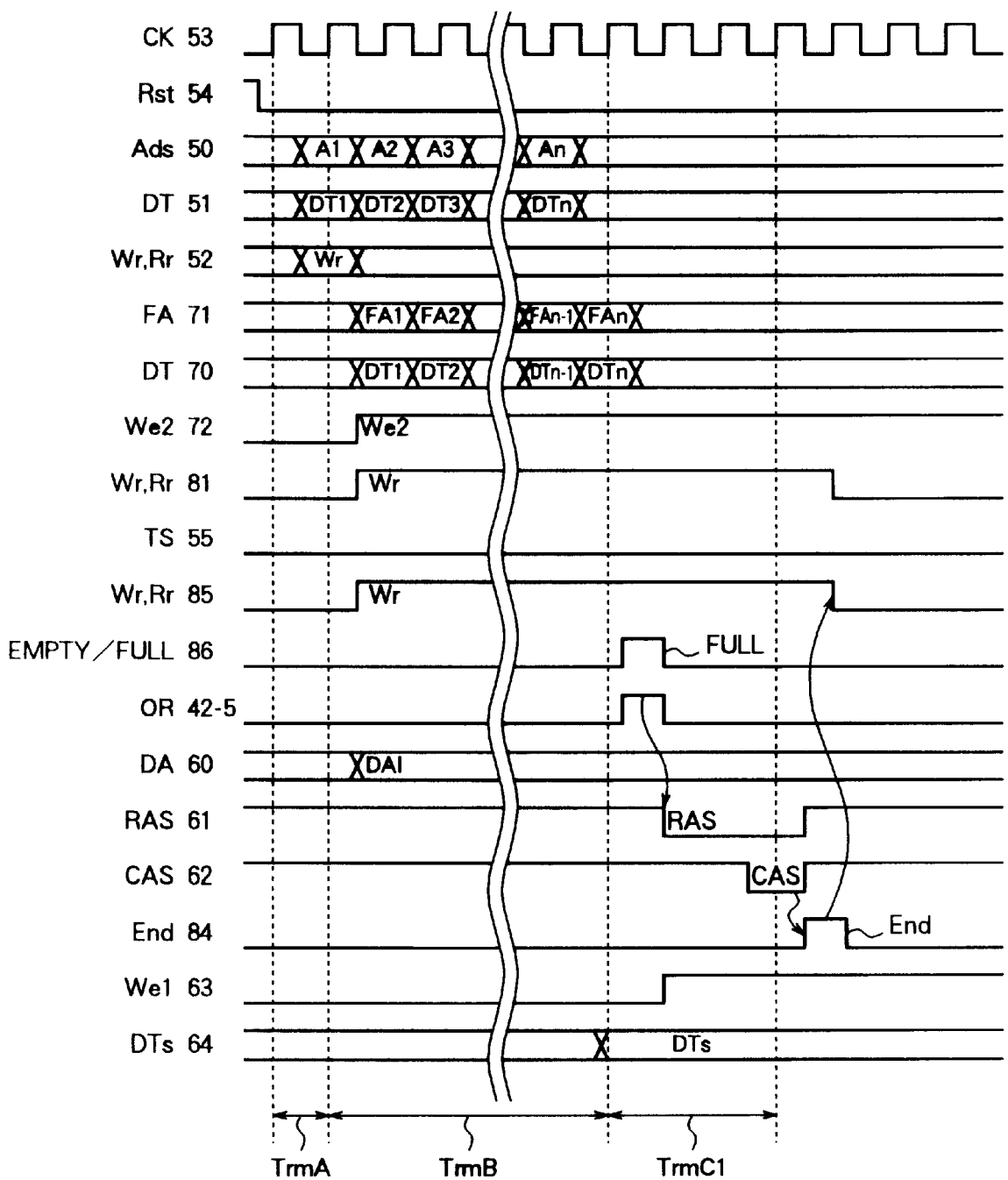
FIG. 8 is a timing diagram illustrating the operation of the first embodiment.

FIG. 8 illustrates the above procedure when the test mode signal TS is low, where the signal names and reference numerals at the left corresponding to the signal names and reference numerals in FIGS. 4 and 5. Operations are synchronized with the clock signal CK as in the conventional case.

During the idle period TrmA, the external test equipment sends a write request Wr on control bus 52, accompanied by an address A1 on address bus 50 and thirty-two bits of data DT1 on data bus 51. The idle period TrmA ends when these signals are read at the rising transition of the clock signal CK.

Upon receiving the write request, the bus controller 42a sends the DRAM controller 42b a write request Wr on signal line 81, and places the received address A1 on the internal address bus 80, the high-order address bits DA1 going to the DRAM controller 42b, the low-order address bits FA1 to the FIFO controller 42c. The received data DT1 are placed on the internal data bus 82 and sent to the FIFO controller 42c.

Upon receiving the write request from the bus controller 42a, the DRAM controller 42b acts according to the test mode signal TS on signal line 55. If TS is low, as in the present case, the DRAM controller 42b begins the sequence of operations in period TrmB by sending the DRAM 41 the high-order address bits DA1 on internal address bus 60, and sending the FIFO controller 42c a write request (Wr) on signal line 85. This write request is generated by AND gate 42-3 from the write request on signal line 81 and the inverted test mode signal output by inverter 42-4. The FIFO controller 42c responds by sending the FIFO 43 a write enable signal (We2) on signal line 72, the low-order address bits FA1 on internal address bus 71, and the received data DT1 on internal data bus 70. The FIFO 43 stores data DT1 at address FA1.

At the same time, the bus controller 42a is receiving the next address A2 and data DT2 from the external test equipment. The low-order bits FA2 of this address A2 and the data DT2 are sent to the FIFO controller 42c in the same way, and stored in the FIFO 43 in the next clock cycle. Subsequent addresses A3 to An and data DT3 to DTn are received and processed similarly, the write request signals on signal lines 81 and 85 and the write enable signal We2 on signal line 72 remaining active (high) throughout. In the DRAM controller 42b, the outputs of AND gates 42-1 and 42-2 remain low because the empty/full signal and TS signal are both low, so the output of OR gate 42-5 remains low.

Period TrmB ends and period TrmC1 begins when the FIFO 43 stores the n-th received data DTn. At this point, the FIFO 43 has received and stored 32×n bits of data. Starting from this time, the entire contents DTs of the FIFO 43 are output on internal data bus 64.

Immediately following the rising clock transition at which data DTn are stored, the FIFO controller 42c drives the empty/full signal high for one clock cycle, to indicate that the FIFO 43 is full. The high empty/full signal on signal line 86 is combined with the write request on signal line 81 by AND gate 42-1 in the DRAM controller 42b, creating a high input to OR gate 42-5.

The output of OR gate 42-5 therefore goes high, causing the control signal generator 42-6 to send the DRAM 41 an active (high) write enable signal We1 on signal line 63, and an active (low) RAS signal on signal line 61. The DRAM 41 now latches and decodes the high-order address bits DA1. After a latency period, the DRAM controller 42b also activates the CAS signal, while RAS remains active. The active (low) CAS signal causes the DRAM 41 to store all of the data DTs on the internal data bus 64 at row address DA1, ending period TrmC1.

At the next falling transition of the clock signal, the DRAM controller 42b deactivates RAS and CAS, and activates the end signal on signal line 84. Upon recognizing the active end signal, the bus controller 42a deactivates the write request on signal line 81, causing the DRAM controller 42b to deactivate the write request on signal line 85, and the test facilitation circuit returns to the idle state. The test data DTs, comprising DT1 to DTn, remain stored in the FIFO 43.

Figure 9:
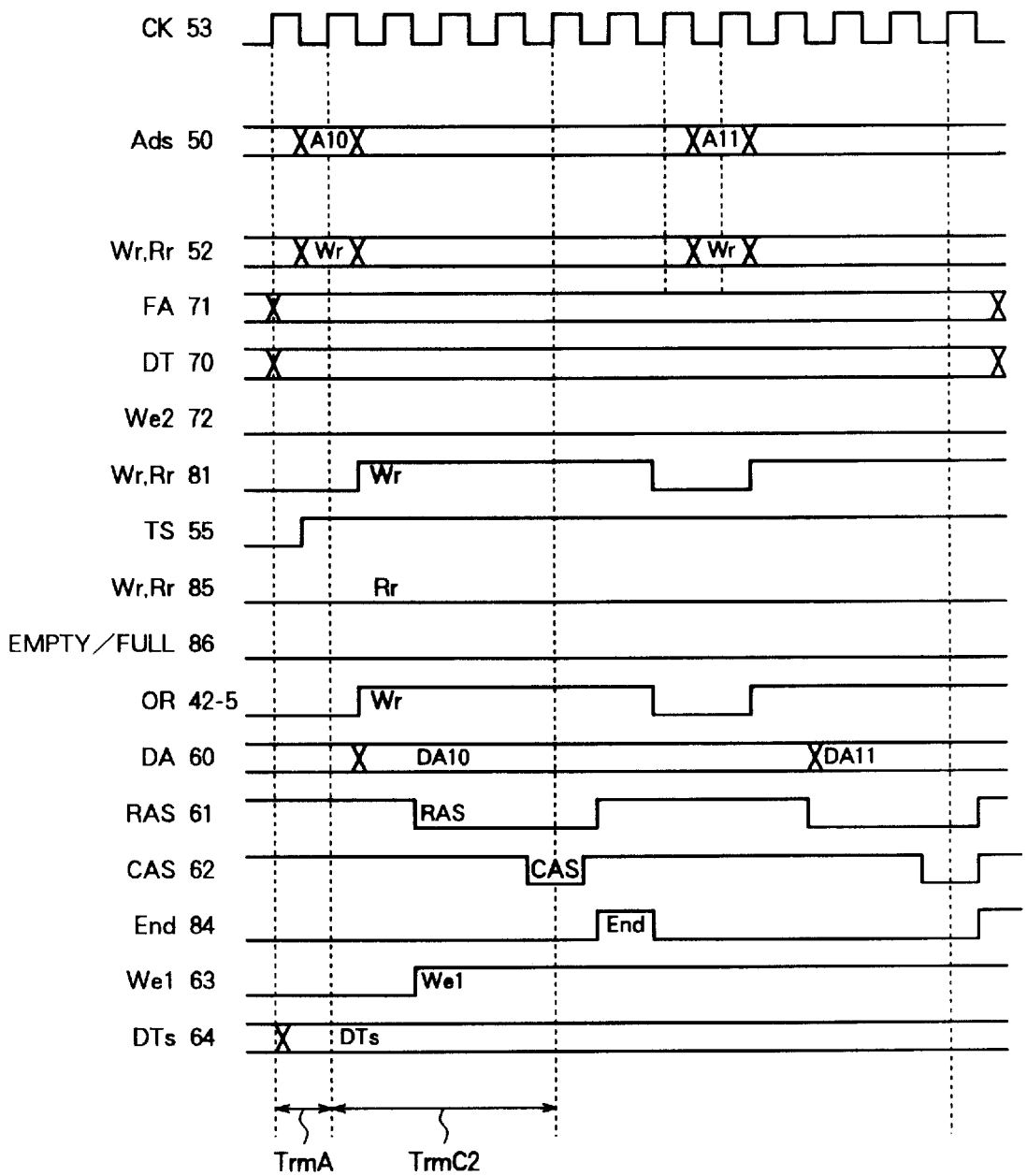
FIG. 9 is another timing diagram illustrating the operation of the first embodiment.

The external test equipment can now write the same test data DTs at different addresses in the DRAM 41 as shown in FIG. 9. During the idle period (TrmA), the external test equipment activates the test mode signal TS, places a new address A10 on the address bus 50, and sends another write request Wr on the control bus 52. The bus controller 42a sends the DRAM controller 42b the high-order bits DA10 of address A10 on internal address bus 80, and a high read-write signal (Wr) on signal line 81.

When the DRAM controller 42b recognizes the address bits DA10 and write request Wr at the next rising clock transition, the DRAM controller also recognizes the high test mode signal TS. The test mode signal TS is inverted by inverter 42-4 in the DRAM controller 42b, creating a low input to AND gate 42-3, thus forcing the read-write signal on signal line 85 to remain low, so that no write request is sent to the FIFO controller 42c. The high TS signal is also combined with the high Wr signal on signal line 81 by AND gate 42-2, creating a high input to OR gate 42-5, the output of which goes high. The write request Wr is thus passed through AND gate 42-2 and OR gate 42-5 to the control signal generator 42-6, and the test facilitation circuit enters period TrmC2 instead of period TrmB.

In period TrmC2, the control signal generator 42-6 sends the DRAM 41 the same sequence of control signals (We1, RAS, CAS) as in period TrmC1 in FIG. 8. The DRAM 41 also receives the high-order address bits DA10 from the DRAM controller 42b on internal address bus 60, and continues to receive the 32×n bits of data DTs stored in the FIFO 43 on internal data bus 64. When the active (low) CAS signal is recognized at the end of period TrmC2, the DRAM 41 stores these same data DTs at row address DA10.

The DRAM controller 42b then deactivates RAS and CAS, and sends the bus controller 42a an end signal on signal line 84, causing the bus controller 42a to deactivate the write request Wr on signal line 81. The test facilitation circuit is now ready to receive another new address A11 and write request Wr from the external test equipment, and store the same data DTs at yet another row address DA11 in the DRAM 41. In this way, the external test equipment can quickly write the test data DTs into all rows of memory cells in the DRAM 41.

To read the written data, the external test equipment sends the bus interface circuit 42 a reset signal on signal line 54, resetting the bus controller 42a, DRAM controller 42b, and FIFO controller 42c and placing the test facilitation circuit in the idle state. Next, the external test equipment sends a read request Rr on the control bus 52, and an address Ads with desired high-order address bits on the address bus 50. Leaving the first write enable signal We1 inactive (low), the DRAM controller 42b sends the received address bits to the DRAM 41 on internal address bus 60, activates the RAS signal, then activates the CAS signal, causing the DRAM 41 to transfer 32×n bits of data from the row of memory cells designated by the address bits to the FIFO 43. The DRAM controller 42b also sends the FIFO controller 42c a read request on signal line 85. The data transferred from the DRAM 41 to the FIFO 43 are then read by the external test equipment in n clock cycles via internal data bus 70 and external data bus 51, in an order determined by further address input.

When the external test equipment tests the memory device by writing a fixed data pattern, such as all-zero data or all-one data, in all rows of memory cells in the DRAM 41, the first embodiment has the external test equipment transfer data for just one row, stores the transferred data in the FIFO 43, and writes the stored data at high speed into all rows. The total write time is reduced to a fraction of the conventional time, because period TrmB is necessary for only the first row, instead of for every row. Because of this increase in testing speed, the memory manufacturer needs less test equipment, and the cost of testing each memory device is reduced accordingly.

Figure 10:
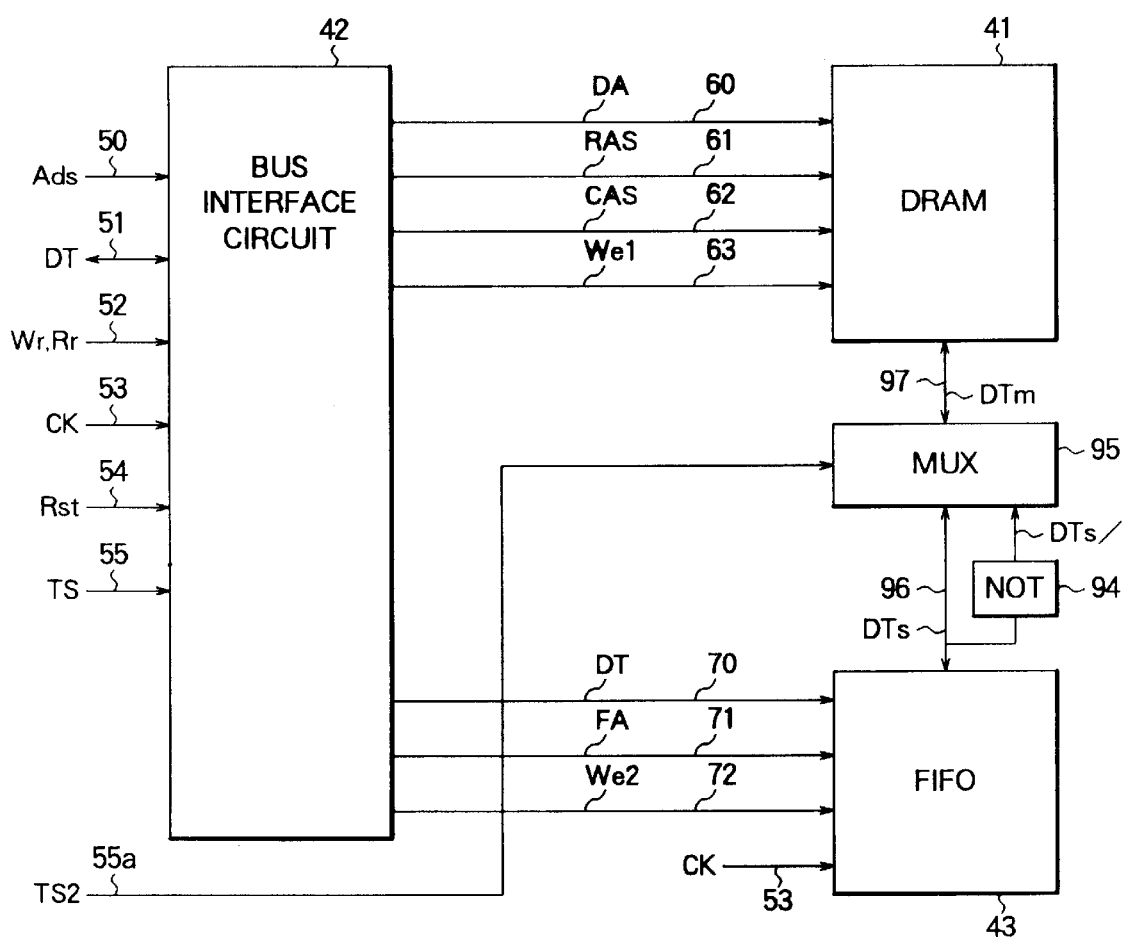
FIG. 10 is a block diagram of a memory device illustrating a second embodiment of the invention.

FIG. 10 illustrates a second embodiment of the invention, using the same reference characters as in FIG. 4 for elements and signals that are the same as in the first embodiment. The new elements are a 32×n-bit complementing circuit or NOT circuit 94, and a multiplexer (MUX) 95. The multiplexer 95 is coupled to the FIFO 43 by a bidirectional data bus 96, and to the DRAM 41 by a bidirectional data bus 97; both data buses 96 and 97 are 32×n bits wide. Together, these two data buses 96 and 97 are equivalent to the internal data bus 64 in the first embodiment, with the multiplexer 95 inserted in the middle.

The NOT circuit comprises 32×n inverters (not visible) that invert the data on data bus 96 and supply the inverted data to the multiplexer 95. The multiplexer 95 selects the data DTs output from the FIFO 43 or the inverted data DTs/ output from the NOT circuit 94 according to a second test mode signal TS2 received on a signal line 55a from the external test equipment, and supplies the selected data DTm to the DRAM 41. Specifically, the multiplexer 95 selects DTs when TS2 is low, and selects the inverted data DTs/ when TS2 is high.

Figure 11:
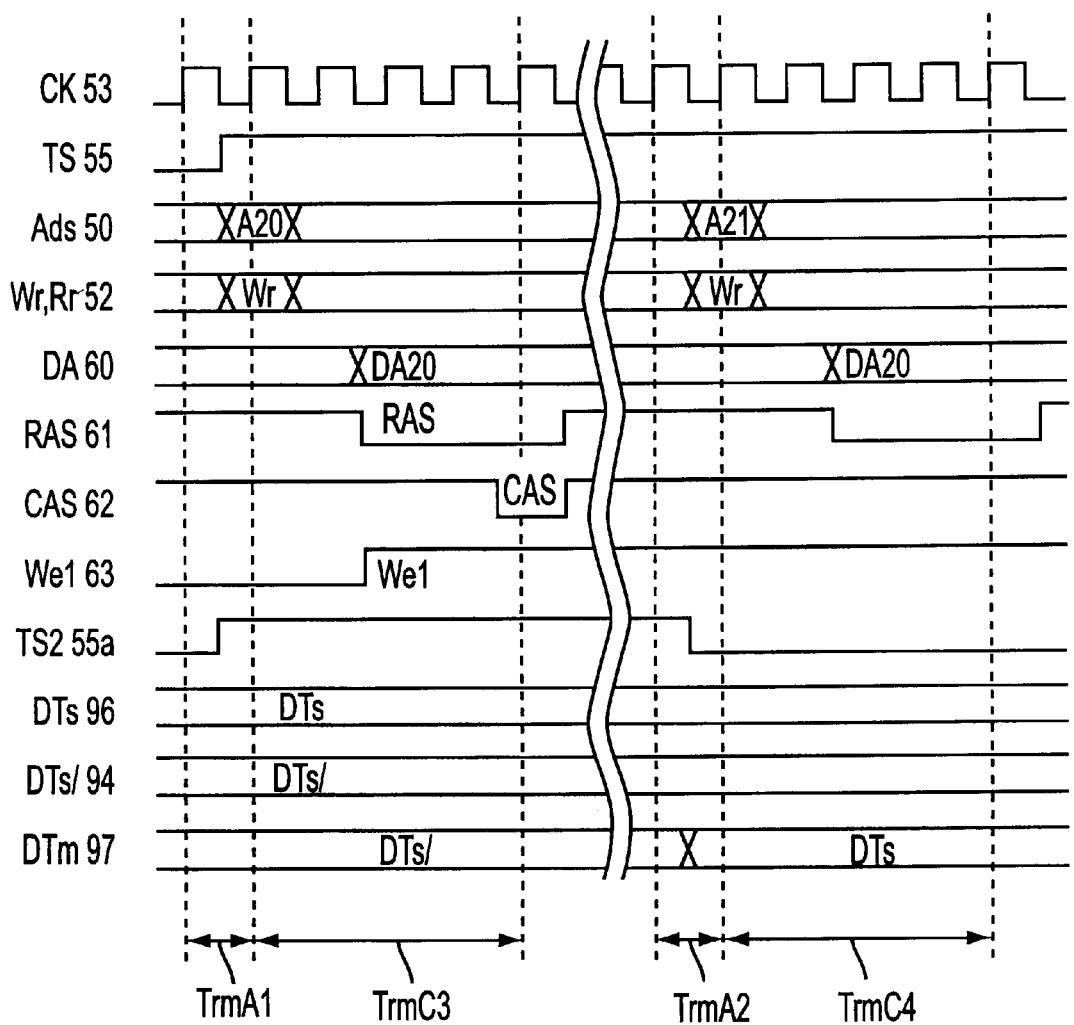
FIG. 11 is a timing diagram illustrating the operation of the second embodiment.

The second embodiment operates in the same way as the first embodiment, as illustrated in FIGS. 7, 8, and 9, except that the external test equipment can invert the data transferred from the FIFO 43 to the DRAM 41 by activating the second test mode signal TS2. For example, after carrying out the operations illustrated in FIG. 8 with both test mode signals TS and TS2 held low, thereby storing test data DTs in the FIFO 43, and at a first row address in the DRAM 41, the external test equipment can use the operations illustrated in FIG. 11 to store inverted test data DTs/ at a second row address DA20.

During period TrmA1, the external test equipment drives both test mode signals TS and TS2 to the high level, and sends a write request Wr together with a second address A20. During period TrmC3, the DRAM controller 42b outputs memory control signals (We1, RAS, CAS) as described in the first embodiment, and the multiplexer 95 selects the inverted data DTs/ output by the NOT circuit 94, because TS2 is high. At the end of period TrmC3, the DRAM 41 stores the inverted data DTs/ at row address DA20.

In a subsequent period TrmA2, the external test equipment sends a new address A21 with a new write request Wr, leaving the first test mode signal TS high but driving the second test mode signal TS2 low. The test data DTs stored in the FIFO 43 are then transferred to the DRAM 41 during period TrmC4, without being inverted, and stored at a new row address DA21.

The second embodiment enables the external test equipment to write a checkerboard test pattern quickly by storing the test data '0101 . . . 01' in the FIFO 43 and in even-numbered rows of memory cells in the DRAM 41, and storing the inverted test data '1010 . . . 10' in odd-numbered rows of memory cells. The checkerboard pattern is useful for testing for interference between adjacent memory cells.

When reading the written data, the external test equipment holds the second test mode signal TS2 at, for example, the low level.

Figure 12:
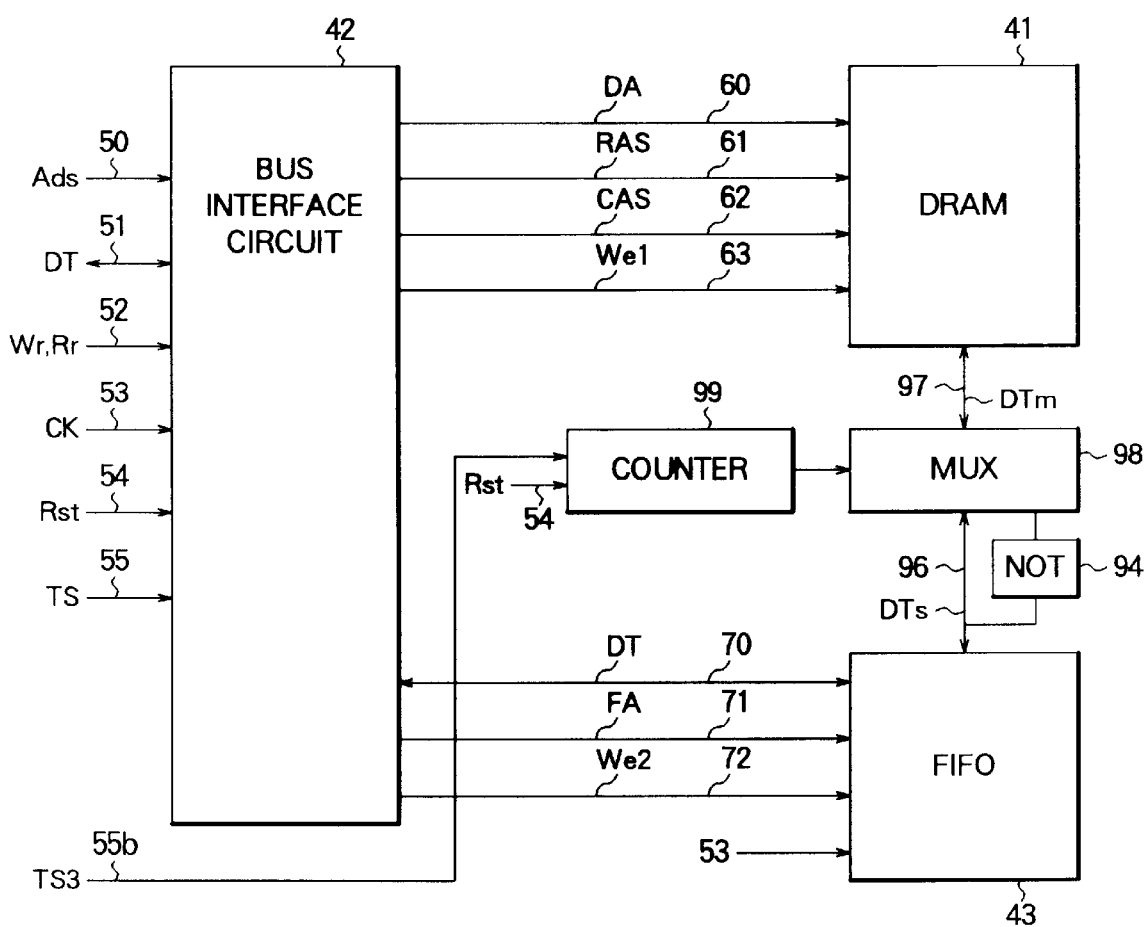
FIG. 12 is a block diagram of a memory device illustrating a third embodiment of the invention.

FIG. 12 illustrates a third embodiment of the invention, using the same reference characters as in FIGS. 4 and 10 for elements and signals that are the same as in the first and second embodiments. Like the second embodiment, the third embodiment has a NOT circuit 94 that inverts the data DTs output by the FIFO 43 on a bidirectional data bus 96. The data DTs and inverted data DTs/ are supplied to a multiplexer 98 that operates according to a transfer count value received from a counter 99.

When the transfer count value is zero, the multiplexer 98 selects all of the data DTs output by the FIFO 43 for transfer to the DRAM 41 on the bidirectional data bus 97. When the transfer count value is m, where m is an integer from one to 32×n, the multiplexer 98 selects the output of the NOT circuit 94 for the m-th data bit, and the output of the FIFO 43 for the other data bits.

The counter 99 is reset to zero by the reset signal Rst on signal line 54, and counts up from zero by counting pulses of a third test mode signal TS3 supplied by the external test equipment on signal line 55b.

Figure 13:
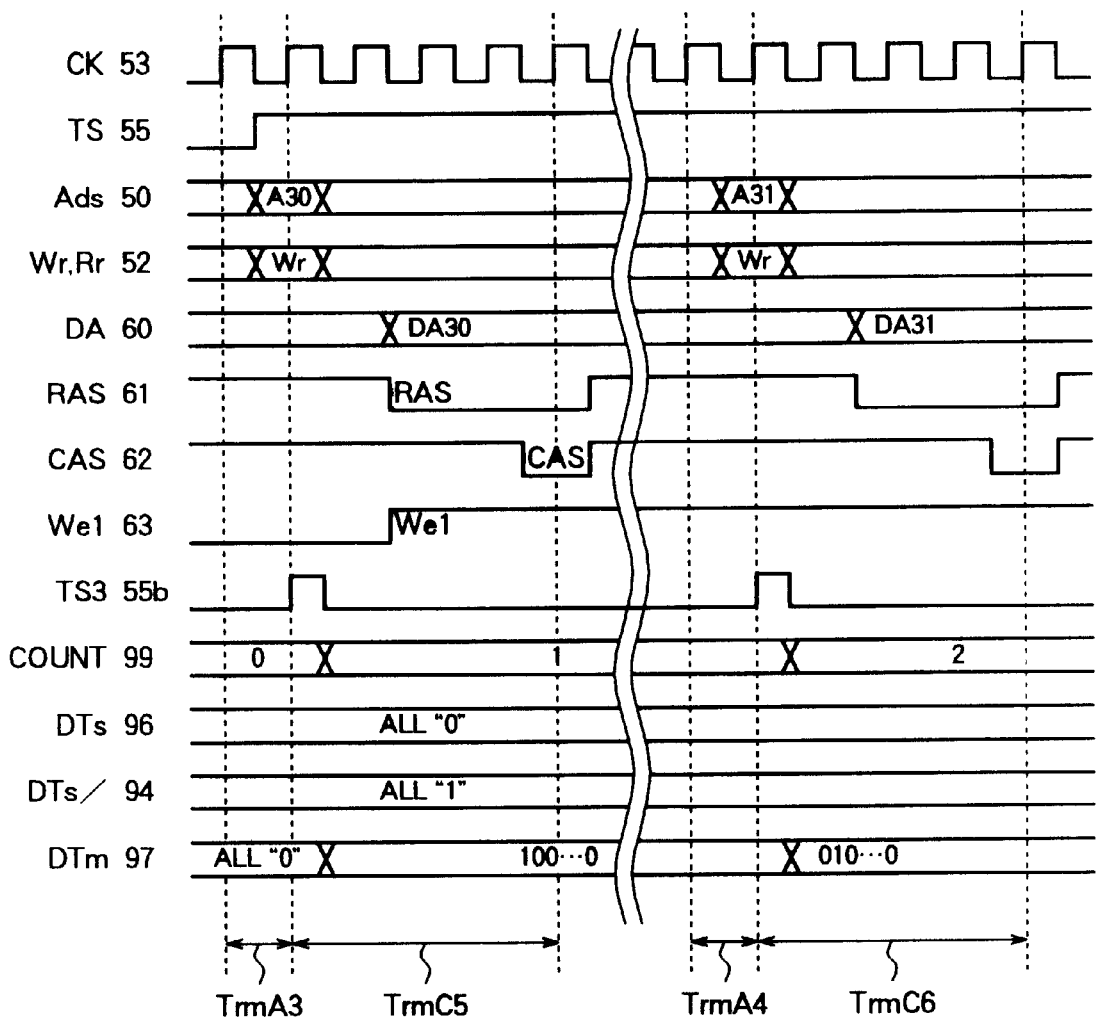
FIG. 13 is a timing diagram illustrating the operation of the third embodiment.

In a typical mode of usage of the third embodiment, the external test equipment begins by resetting the test facilitation circuit and storing all-zero data '000000 . . . ' in the FIFO 43, by following the procedure illustrated in FIG. 8, with the first and third test mode signals TS and TS3 both held low. Referring to FIG. 13, the external test equipment then drives the first test mode signal TS to the high level, sends a new address A30 and write request Wr in period TrmA3, and sends a TS3 pulse that increments the counter 99 from zero to one. Since the first test mode signal TS is high, the DRAM 41 generates DRAM control signals (We1, RAS, CAS) during period TmC5. Since the count value is one, the multiplexer 98 selects the inverted data value '1' for the first bit, and the non-inverted zero data value '0' for the other bits, thus sending data '100000 . . . ' to the DRAM 41. The DRAM 41 stores these data DTm at row address DA30.

The external test equipment continues operating in this way, next sending an address A31, a write request Wr, and another TS3 pulse, incrementing the counter 99 from one to two. The multiplexer 98 now selects '1' for the second bit and '0' for the other bits, sending the DRAM 41 the data '010000 . . . ,' which the DRAM 41 stores at row address DA31.

The third embodiment enables a so-called walking test pattern, comprising data '1000 . . . 0,' '01000 . . . 0,' '0010 . . . 0' and so on, to be stored quickly in the DRAM 41. Like the checkerboard pattern, the walking pattern is used to test for interference between memory cells.

Figure 14:
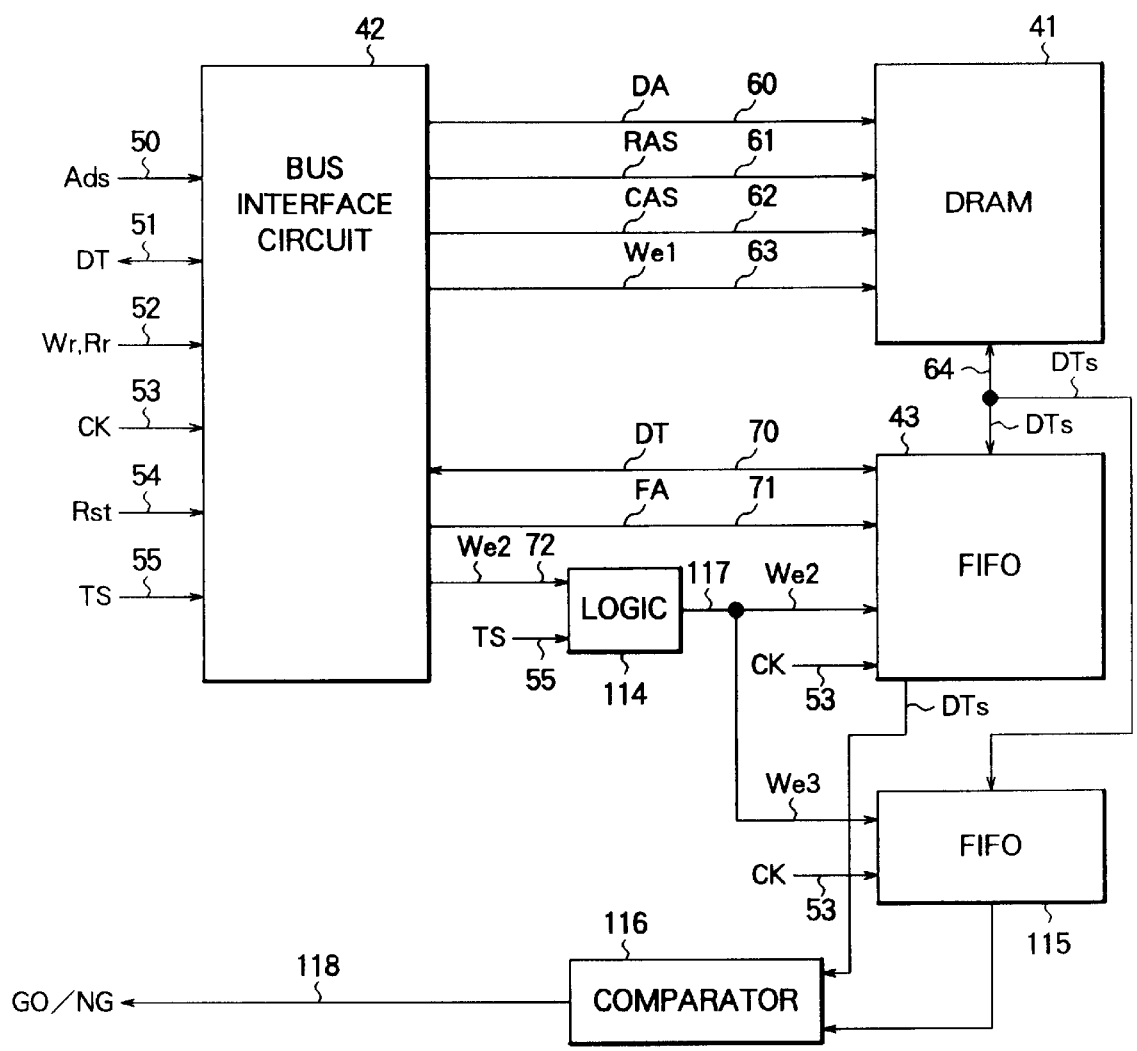
FIG. 14 is a block diagram of a memory device illustrating a fourth embodiment of the invention.

FIG. 14 illustrates a fourth embodiment of the invention, using the same reference characters as in FIG. 4 for elements and signals that are the same as in the first embodiment. FIFO 43 will be referred to as the first FIFO. In addition, the fourth embodiment has a logic circuit 114 that receives the test mode signal TS and second write enable signal We2, a second auxiliary memory circuit or FIFO 115 coupled to the same data bus 64 as the first FIFO 43, a comparator 116 that compares the entire contents of the first FIFO 43 with the entire contents of the second FIFO 115, a signal line 117 supplying output signals from the logic circuit 114 to the first FIFO 43 and second FIFO 115, and a signal line 118 supplying the output of the comparator 116 to the external test equipment (not visible). The comparator output is a go/no-go signal (GO/NG) indicating whether the entire contents of the first FIFO 43 match the entire contents of the second FIFO 115.

Like the first FIFO 43, the second FIFO 115 has a capacity of 32×n bits. The second FIFO 115 receives only the clock signal CK and the output of logic circuit 114, inputs data only from the DRAM 41, and outputs data only to the comparator 116.

The fourth embodiment writes test data into the first FIFO 43 and DRAM 41 by the same method as the first embodiment, illustrated in FIGS. 7, 8, and 9. In the following description, it will be assumed that the external test equipment has transferred all-zero data to the first FIFO 43, and that these all-zero data have been written into all rows of memory cells in the DRAM 41.

Figure 15:
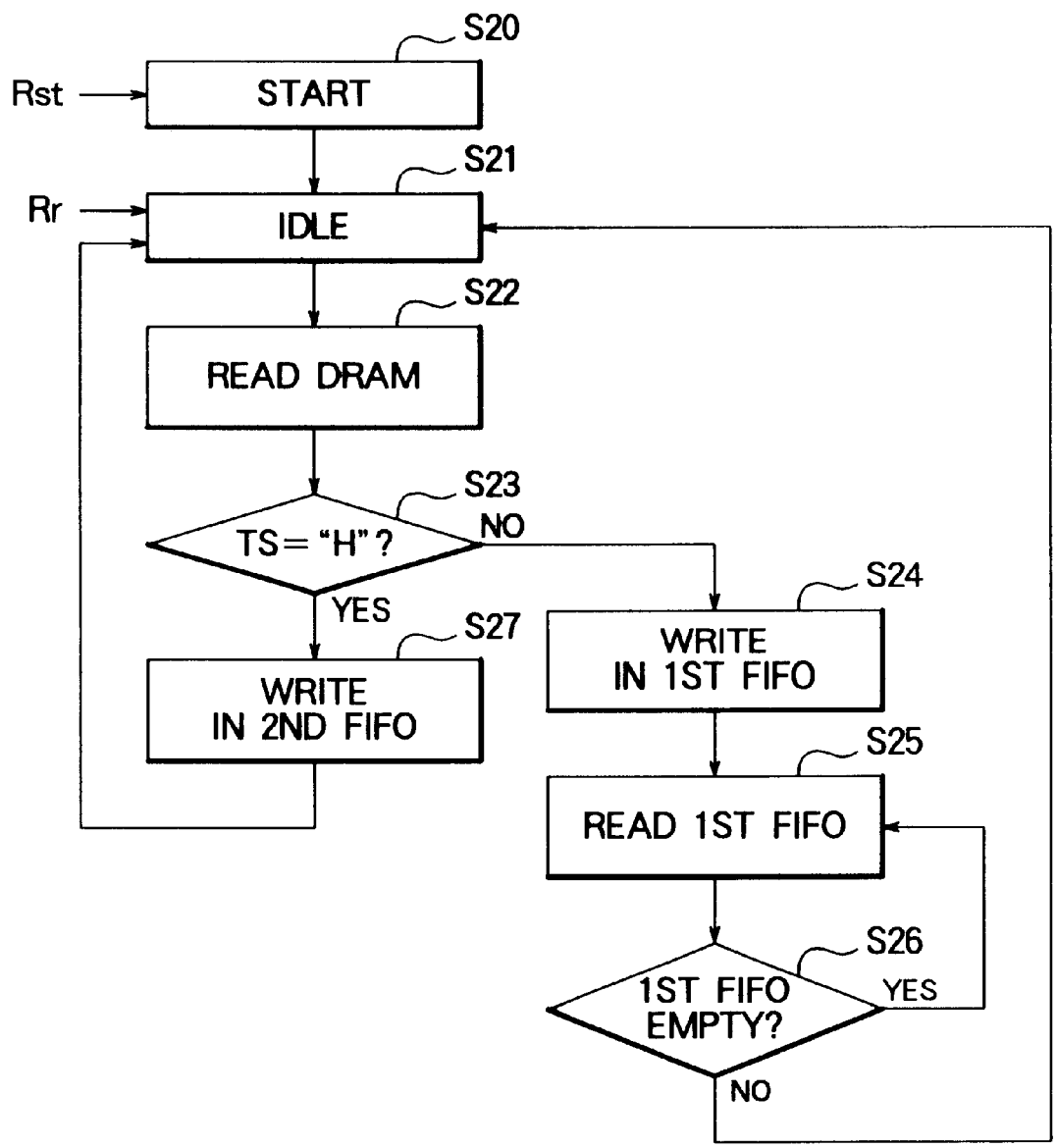
FIG. 15 is a flowchart illustrating the operation of the fourth embodiment.

In reading the test data, the fourth embodiment operates as indicated in FIG. 15. The external test equipment begins by sending a reset signal (step S20), and placing the test facilitation circuit in the idle state (step S21). A read request (Rr) received in the idle state causes the DRAM controller 42b to generate control signals that read the contents of a designated row of memory cells from the DRAM 41 onto internal data bus 64 (step S22). The destination of the data thus read depends on whether the test mode signal TS is high or low (step S23). If TS is low, the data are written into the first FIFO 43 (step S24). The external test equipment then reads the data from the first FIFO 43, thirty-two bits at a time (step S25), until the first FIFO 43 is empty (step S26). If TS is high, the data are written into the second FIFO 115 (step S27), but are not read by the external test equipment. Following step S27, or when the first FIFO 43 becomes empty in step S26, the test facilitation circuit returns to the idle state to await the next request from the external test equipment.

Figure 16:
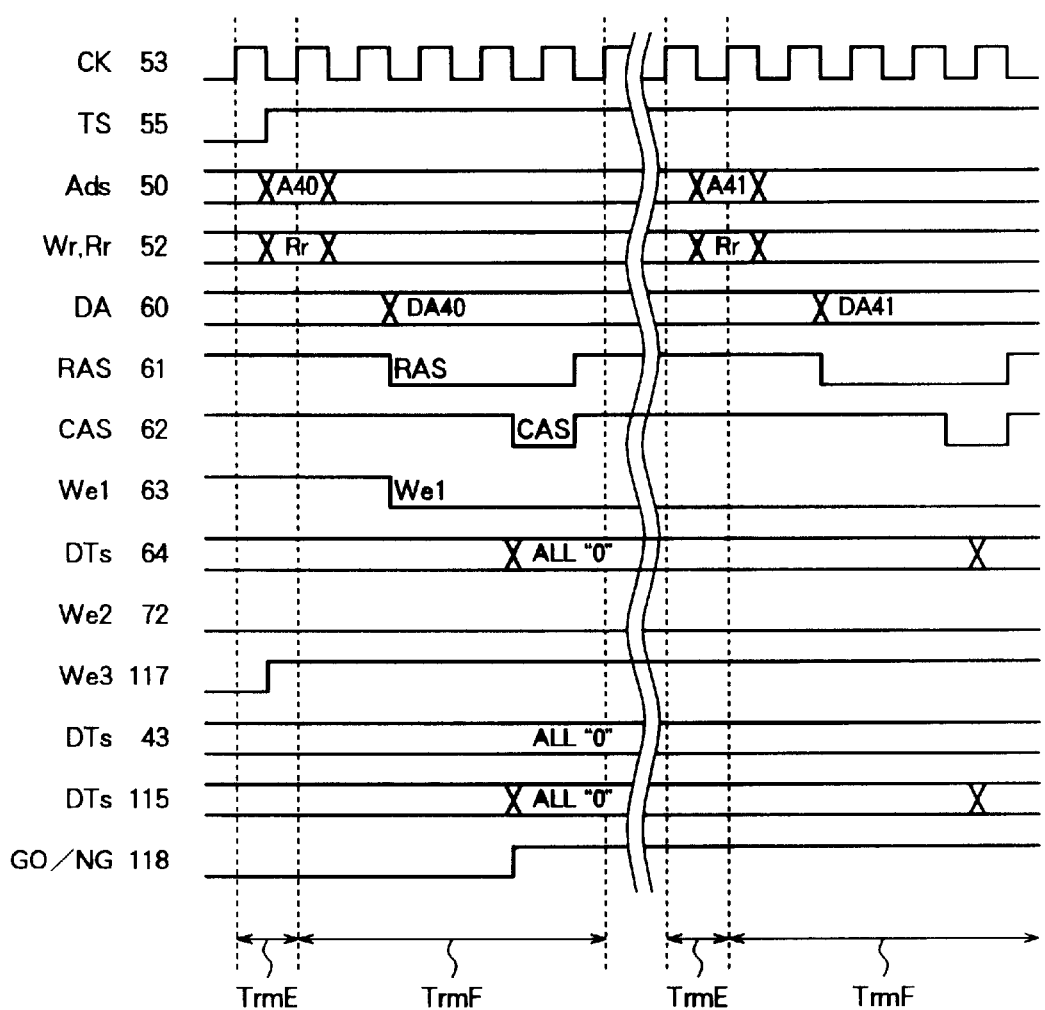
FIG. 16 is a timing diagram illustrating the operation of the fourth embodiment.

FIG. 16 illustrates the signals associated with steps S21, S22, and S27 in FIG. 15, after the all-zero test pattern has been written into the DRAM 41. During the idle state (TrmE), the external test equipment drives the test mode signal TS to the high level, and sends a read request (Rr) accompanied by an address (A40). The DRAM controller in the bus interface circuit 42 responds to the read request by sending the high-order address bits DA40 to the DRAM 41, setting the DRAM write enable signal We1 to the low level to designate read access, and generating RAS and CAS signals. The DRAM 41 outputs the 32×n bits of data from the row designated by address DA40 onto the internal address bus 64.

To avoid writing these 32×n bits of data into the first FIFO 43, the bus interface circuit 42 does not activate the second write enable signal We2. The logic circuit 114 accordingly does not send a write enable signal to the first FIFO 43, but since the test mode signal TS is high, the logic circuit 114 sends an active write enable signal We3 to the second FIFO 115, causing the second FIFO 115 to store the 32×n bits of data output by the DRAM 41.

The first FIFO 43 continues to store the all-zero data that were written by the external test equipment. After having been transferred to all rows in the DRAM 41, these data have now been read from row DA40 into the second FIFO 115, so the second FIFO 115 should also contain all-zero data, as indicated in FIG. 16. Comparing the all-zero data in the first FIFO 43 with the all-zero data in the second FIFO 115, the comparator 116 drives the go/no-go signal (GO/NG) to the high level, notifying the external test equipment that the data match, hence that all memory cells in row DA40 are functioning correctly.

The external test equipment is thus able to verify correct operation of an entire row of memory cells in a short period of time (TrmF), without actually having to read the data, and can proceed immediately to verify the next row in the same way, by sending another read request (Rr) and a new address (A41). As long as the second FIFO 115 continues to receive all-zero data from the DRAM 41, the go/no-go signal remains high.

If the go/no-go signal goes low, indicating that incorrect data were read from the DRAM 41, the external test equipment can drive the test mode signal TS to the low level and follow steps S24, S25, and S26 in FIG. 15 to determine which particular memory cell in the DRAM 41 returned incorrect data. Steps S24, S25, and S26 are also used to verify test patterns in which different data are written into each row of memory cells.

By comparing the written and read test data inside the memory device, the fourth embodiment greatly reduces the time needed for verification of the all-zero and all-one test patterns.

Figure 17:
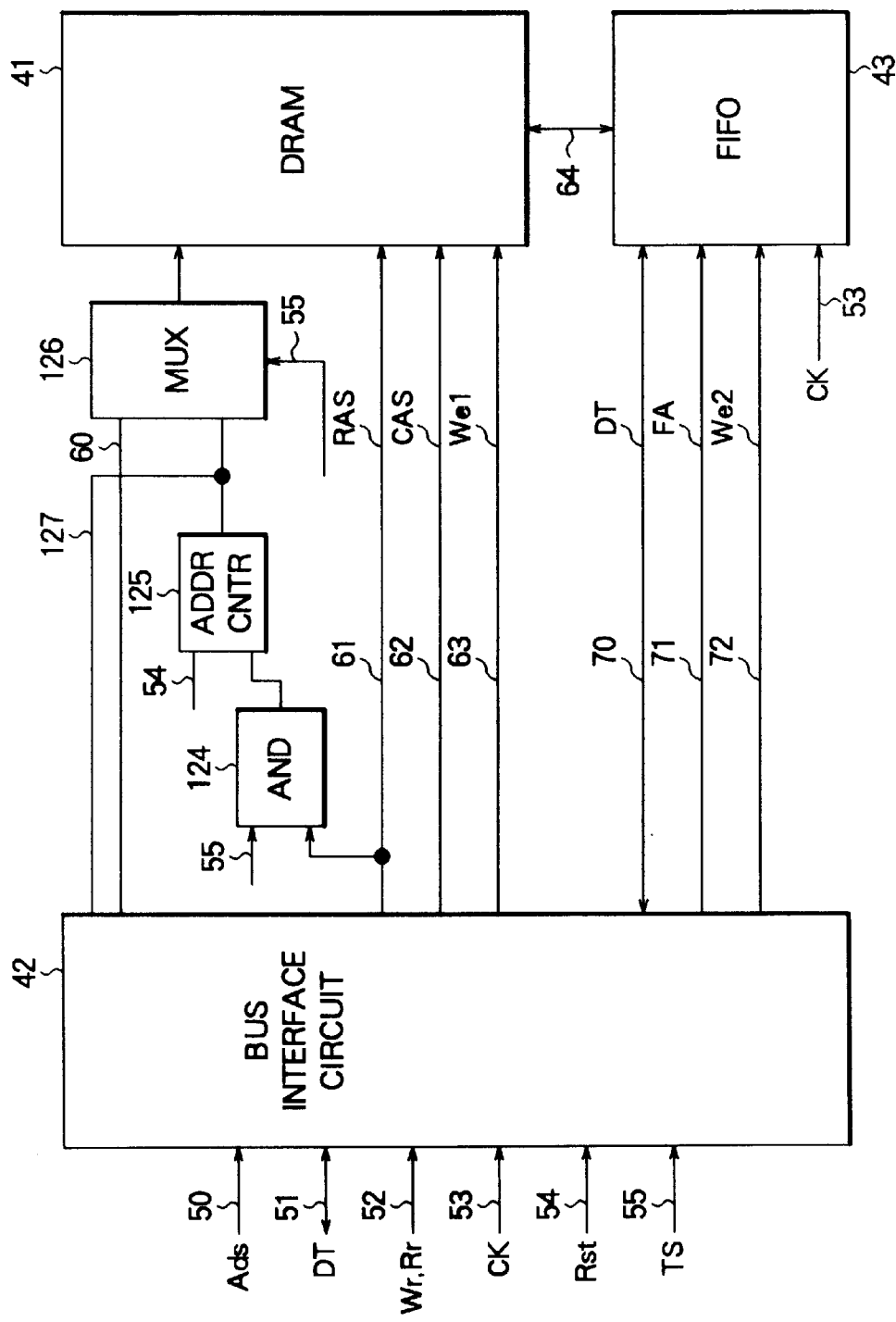
FIG. 17 is a block diagram of a memory device illustrating a fifth embodiment of the invention.

FIG. 17 illustrates a fifth embodiment of the invention, using the same reference characters as in FIG. 4 for elements and signals that are the same as in the first embodiment. The fifth embodiment differs from the first embodiment in having an AND gate 124 that combines the RAS signal output by the bus interface circuit 42 with the test mode signal on signal line 55, an address counter 125 that counts pulses output from the AND gate 124, and a multiplexer 126. The multiplexer 126 selects either the high-order address bits DA on internal address bus 60, or the count output by the address counter 125, received on another bus 127, and supplies the selected input as address information to the DRAM 41. The selection is made according to the test mode signal on signal line 55.

Figure 18:
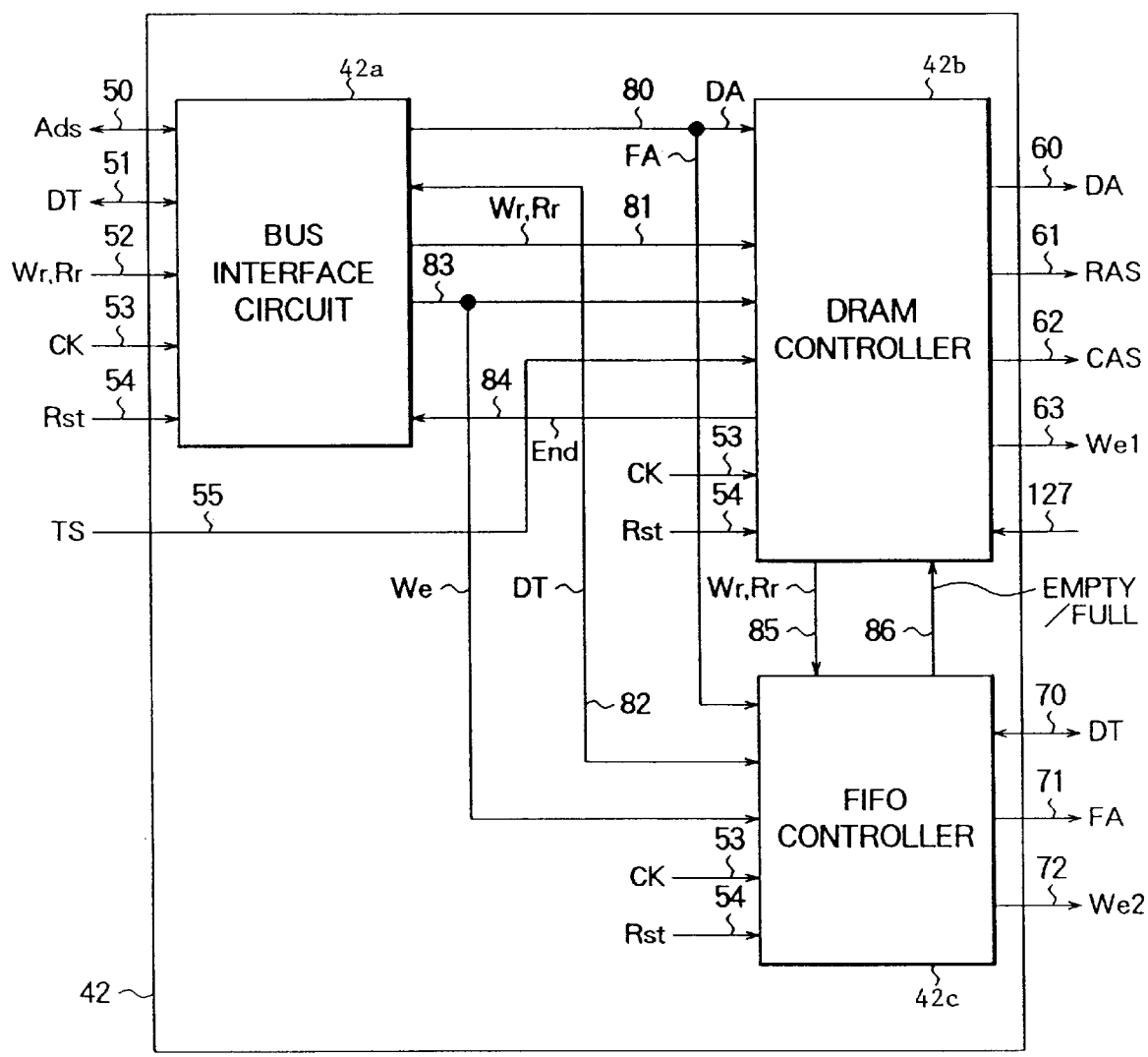
FIG. 18 is a more detailed block diagram of the bus interface circuit in FIG. 17.

The address counter 125 is reset by the reset signal on signal line 54. The count output by the address counter 125 is also returned to the bus interface circuit 42 on bus 127. As shown in FIG. 18, the count is received by the DRAM controller 42b. The DRAM controller 42b has an internal circuit (not shown) that detects overflow of the count from a maximum value equal, for example, to the number of rows of memory cells in the DRAM 41, to a minimum count equal, for example, to zero. When an overflow is detected, this internal circuit activates the end signal on signal line 84, and places the DRAM controller 42b in the idle state. Other than this additional internal circuit, the configuration of the bus interface circuit in the fifth embodiment is similar to the configuration of the bus interface circuit in the first embodiment, shown in FIG. 5, so a repeated description will be omitted.

Figure 19:
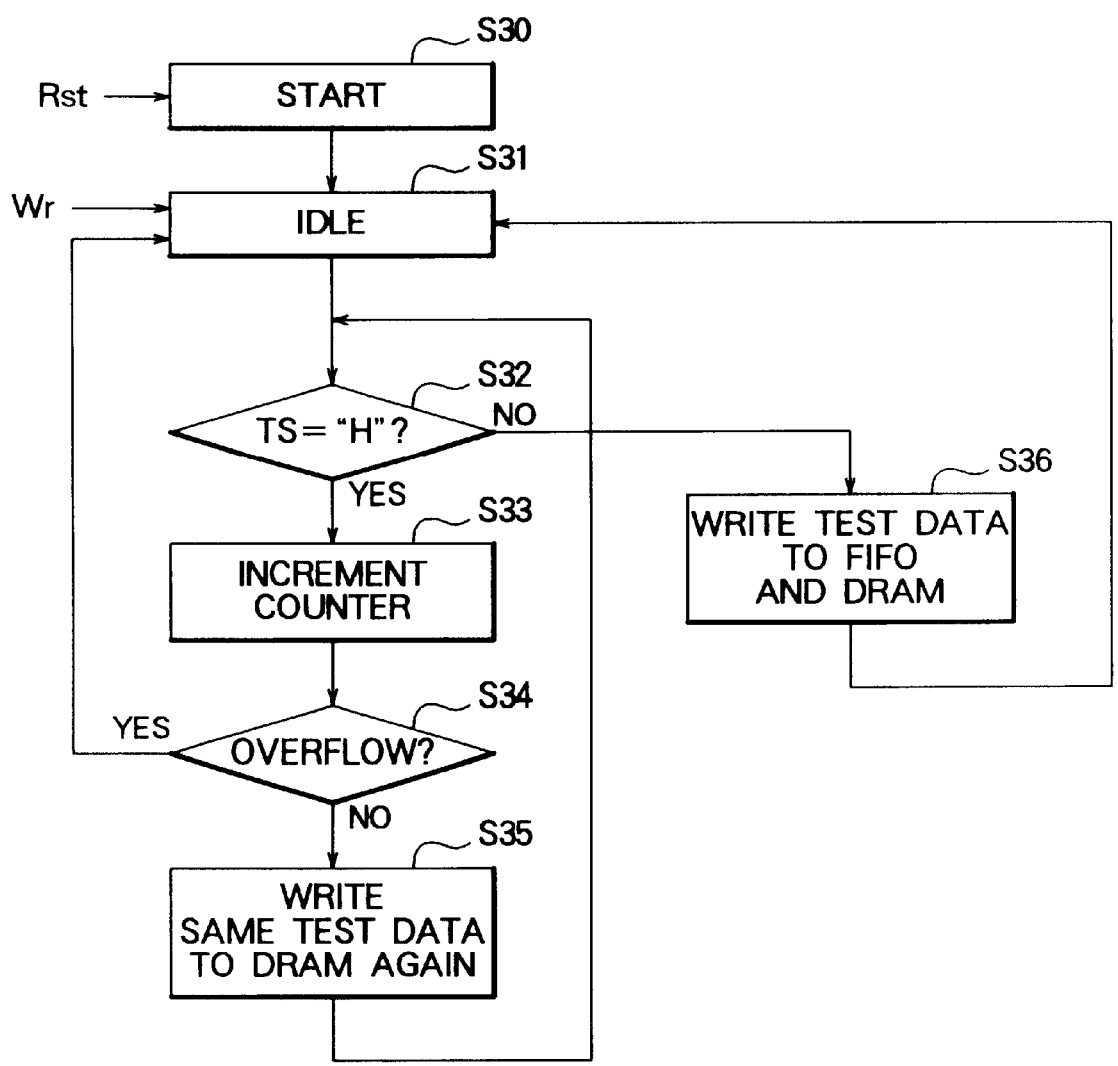
FIG. 19 is a flowchart illustrating the operation of the fifth embodiment.

The fifth embodiment writes test data into the memory device by the procedure shown in FIG. 19. The external test equipment first activates the reset signal, thereby resetting the address counter 125, then deactivates the reset signal (step S30), placing the test facilitation circuit in the idle state (step S31), and sends a write request signal (Wr). The bus interface circuit 42 uses the test mode signal TS to determine how to respond to the write request (step S32). If TS is high, the address counter 125 is incremented (step S33). If the address counter 125 does not overflow (step S34), the contents of the FIFO 43 are immediately transferred to the DRAM 41 and stored at the address designated by the address counter 125 (step S35). The loop comprising steps S32, S33, S34, and S35 is repeated until the address counter 125 overflows, or until the test mode signal TS is driven low. When TS is low, the external test equipment transfers test data to the FIFO 43, and the test data are written into the DRAM 41 at an address designated by the external test equipment (step S36). Step S36 is identical to step S14 in the first embodiment, and to steps S2 to S4 in the conventional test facilitation circuit.

Following step S36, or following an overflow in step S34, the test facilitation circuit returns to the idle state (step S31).

To write an all-zero test pattern, for example, the external test equipment first sets the test mode signal TS to the low level, then sends a reset signal Rst, followed by a write request, zero address information, and all-zero test data. The reset signal resets the address counter 125 to zero. The other signals load all-zero data into the FIFO 43 as explained in the first embodiment, and write the data into the row of memory cells with the designated row address (zero) in the DRAM 41. The multiplexer 126 selects the address output by the bus interface circuit 42 because the test mode signal TS is low. Also because TS is low, the output of AND gate 124 is held at the low level, so the address counter 125 remains halted at zero.

Figure 20:
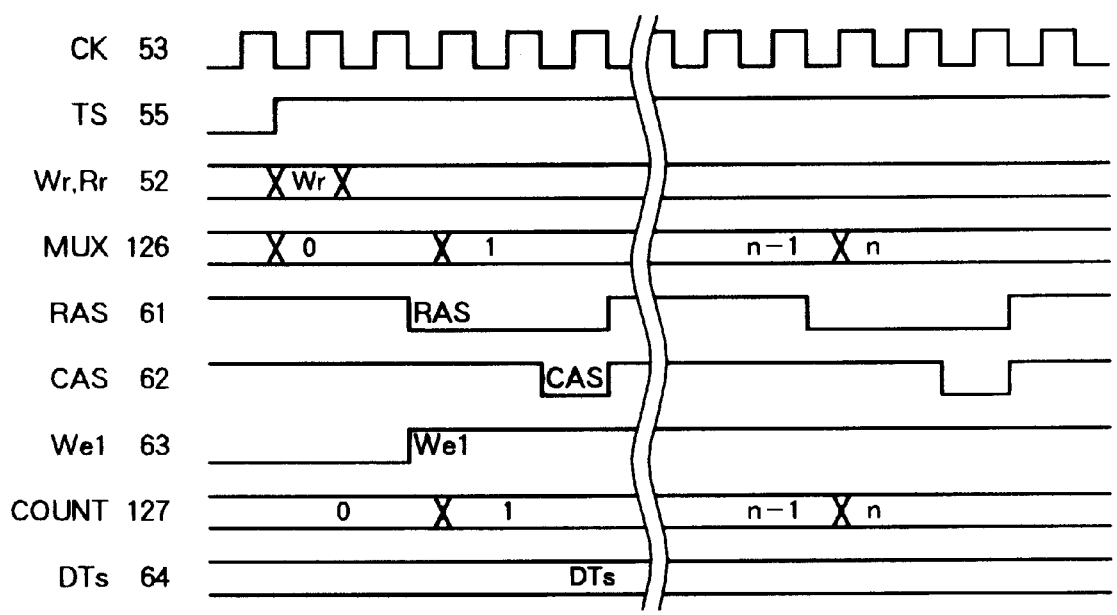
FIG. 20 is a timing diagram illustrating the operation of the fifth embodiment.

To write the same all-zero data to the other memory cells in the DRAM 41, the external test equipment sets the test mode signal TS to the high level and sends one more write request. Since TS is high, the DRAM controller 42b responds by immediately generating DRAM control signals (We1, RAS, CAS) as explained in the first embodiment, without sending a write request to the FIFO controller 42c. In addition, since TS is high, the AND gate 124 passes the transitions of the RAS signal to the address counter 125. Referring to FIG. 20, the address counter 125 increments from zero to one at the first high-to-low transition of the RAS signal. Since TS is high, the multiplexer 126 selects the output of the address counter 125. When CAS goes low, the all-zero contents of the FIFO 43 are written to the row with address one in the DRAM 41.

As indicated in FIGS. 19 and 20, the DRAM controller 42b continues to generate RAS and CAS signals without requiring further input of write requests from the external test equipment. Since TS remains high, each high-to-low transition of the RAS signal increments the address counter 125, and the multiplexer 126 continues to supply the output of the address counter to the DRAM 41 as address information. Thus the all-zero data held in the FIFO 43 are written to all rows of memory cells in the DRAM 41.

When the all-zero data have been written into the last row of memory cells in the DRAM 41, at the next high-to-low transition of the RAS signal, the address counter 125 overflows, causing the DRAM controller 42b to activate the end signal and return immediately to the idle state, without activating the CAS signal.

When the same test data are written in every row of memory cells in the DRAM 41, the fifth embodiment enables the test data to be written even more quickly than in the first embodiment, because the test facilitation circuit does not have to wait for a write request from the external test equipment before writing to each new row. Write requests are submitted only for the first two rows. In addition, the external test equipment has to generate address information only for the first row, other addresses being generated automatically by the address counter 125 in the memory device, so the test patterns are considerably simplified.

The invention is not limited to the embodiments described above. A few of the many possible variations are briefly mentioned below.

The FIFO 43 can generate its own address information internally, without requiring external input of address information.

In that case, the external test equipment need only supply row address information to the memory device.

The second write enable signal We2 can be activated only during the actual writing of data into the FIFO 43, instead of being left high as shown in FIGS. 3 and 8.

The FIFO 43 may also receive a read enable signal, and/or a direction signal indicating whether data are to be input from the bus interface circuit 42 and output to the DRAM 41, or input from the DRAM 41 and output to the bus interface circuit 42.

The empty/full signal can be generated by the external test equipment, instead of the FIFO controller 42c.

The second FIFO 115 in the fourth embodiment can be eliminated, the comparator 116 being connected directly to the internal data bus 64, especially if the data read from the DRAM 41 are held on the internal data bus 64 as shown in FIG. 16.

The fourth embodiment can be combined with the second or third embodiment.

The fifth embodiment can be combined with the second, third, or fourth embodiment.

Test patterns other than those mentioned in the embodiments can be employed.

Those skilled in the art will recognize that further variations are possible within the scope claimed below.

What is claimed is:

1. A test facilitation circuit integrated into a memory device having a main memory circuit with a plurality of memory cells, to facilitate testing of said main memory circuit by external test equipment, comprising:
    a first auxiliary memory circuit storing test data;
    an internal data bus coupling said first auxiliary memory circuit to said main memory circuit;
    an interface circuit receiving address information, a read request signal, and a write request signal from said external test equipment, and transferring said test data to and from said external test equipment;
    an auxiliary memory controller coupled to said interface circuit, controlling access to said first auxiliary memory circuit; and
    a main memory controller coupled to said interface circuit, receiving a first test mode signal from said external test equipment, responding to said write request signal when said first test mode signal is in one state by directing said auxiliary memory controller to transfer said test data from said interface circuit to said first auxiliary memory circuit, then by transferring said test data from said first auxiliary memory circuit to said main memory circuit, and responding to said write request signal when said first test mode signal is another state by transferring test data previously stored in said first auxiliary memory circuit immediately from said first auxiliary memory circuit to said main memory circuit.

2. The test facilitation circuit of claim 1, wherein said auxiliary memory controller sends said main memory controller a status signal, indicating storage of said test date in said first auxiliary memory circuit, upon completion of transfer of said test data from interface circuit to said first auxiliary memory circuit, and when said first test mode signal is in said one state, said main memory controller transfers said test data from said first auxiliary memory circuit to said main memory circuit in response to said status signal.

3. The test facilitation circuit of claim 2, wherein said main memory controller comprises:
    a first logic gate receiving said write request signal and said status signal;
    a second logic gate receiving said write request signal and said first test mode signal;
    an inverter receiving said first test mode signal;
    a third logic gate receiving said write request signal and the inverted first test mode signal, thereby generating a signal controlling said auxiliary memory controller;
    a fourth logic gate receiving inputs from said first logic gate and said second logic gate; and
    a control signal generator generating control signals for said main memory circuit according to an output of said fourth logic gate.

4. The test facilitation circuit of claim 1, further comprising:
    a complementing circuit coupled to said first auxiliary memory circuit, generating a logical complement of the test data stored in said first auxiliary memory circuit; and
    a multiplexer inserted in said internal data bus, receiving a second test mode signal from said external test equipment, selecting one of the test data stored in said first auxiliary memory circuit and the logical complement of said test data generated by said complementing circuit for transfer to said main memory circuit, responsive to said second test mode signal.

5. The test facilitation circuit of claim 1, further comprising:
    a complementing circuit coupled to said first auxiliary memory circuit, generating a logical complement of the test data stored in said first auxiliary memory circuit;
    a counter receiving a second test mode signal from said external test equipment, generating a count signal by counting pulses of said second test mode signal; and
    a multiplexer inserted in said internal data bus, selecting a bit of the test data output by said first auxiliary memory circuit according to said count signal, and replacing the selected bit with a complementary bit generated by said complementing circuit, for transfer to said main memory circuit.

6. The test facilitation circuit of claim 1, further comprising:
    a comparator coupled to said first auxiliary memory circuit, comparing the test data stored in said first auxiliary memory circuit with data read from said main memory circuit, and supplying a comparison result signal to said external test equipment.

7. The test facilitation circuit of claim 6, further comprising:
    a second auxiliary memory circuit coupled to said internal data bus, storing said data read from said main memory circuit; and
    a logic circuit coupled to said auxiliary memory controller, receiving said first test mode signal, selecting one of said first auxiliary memory circuit and said second auxiliary memory circuit according to said first test mode signal, and causing said auxiliary memory controller to respond to said read request signal by transferring data from said main memory circuit to the selected auxiliary memory circuit.

8. The test facilitation circuit of claim 1, further comprising:
    an address counter coupled to said main memory controller, counting transfers of test data from said first auxiliary memory circuit to said main memory circuit, thereby generating internal address information; and
    a multiplexer coupled to said address counter, selecting one of the address information received by said interface circuit and the internal address information generated by said address counter, for supply to said main memory circuit.

9. The test facilitation circuit of claim 1, wherein said memory device is a dynamic random-access memory device.

10. A method of testing a memory device having a main memory circuit and an auxiliary memory circuit, comprising the steps of:

transferring test data from external test equipment to said auxiliary memory circuit;

storing said test data in said auxiliary memory circuit;

generating a status signal indicating that said test data have been stored in said auxiliary memory circuit;

transferring said test data from said auxiliary memory circuit to one location in said main memory circuit, responsive to said status signal;

receiving a write request signal from said external test equipment; and transferring said test data from said auxiliary memory circuit to another location in said main memory circuit, responsive to said write request signal.

11. The method of claim 10, wherein said main memory circuit comprises a row-column array of memory cells, and said one location and said another location are disposed in different rows in said row-column array.

12. The method of claim 10, further comprising the steps of:

sending a mode signal from said external test equipment to said memory device; and inverting the test data transferred from said auxiliary memory circuit to said main memory circuit, responsive to said mode signal.

13. The method of claim 10, further comprising the steps of:

sending a mode signal from said external test equipment to said memory device;

counting transfers of said test data from said auxiliary memory circuit to said main memory circuit, thereby generating a transfer count; and inverting one bit in the test data transferred from said auxiliary memory circuit to said main memory circuit, responsive to said mode signal, said one bit being designated by said transfer count.

14. The method of claim 10, wherein said memory device has an internal address counter, further comprising the steps of:

using said internal address counter to count transfers of said test data from said auxiliary memory circuit to said main memory circuit, thereby generating an address count; and using said address count to designate said different locations in said main memory circuit.

15. The method of claim 10, further comprising the steps of:

providing a comparator in said memory device;

reading data from said main memory circuit into said comparator; and using said comparator to compare the data read from said main memory circuit with the test data stored in said auxiliary memory circuit.

16. A test facilitation circuit integrated into a memory device having a main memory circuit with a plurality of memory cells, to facilitate testing of said main memory circuit by external test equipment, comprising:

a first auxiliary memory circuit storing test data;

an internal data bus coupling said first auxiliary memory circuit to said main memory circuit;

an interface circuit receiving address information, a read request signal, and a write request signal from said external test equipment, and transferring said test data to and from said external test equipment;

an auxiliary memory controller coupled to said interface circuit, controlling access to said first auxiliary memory circuit; and a main memory controller coupled to said interface circuit, receiving a first test mode signal from said external test equipment, responding to said write request signal when said first test mode signal is in one state by directing said auxiliary memory controller to transfer said test data from said interface circuit to said first auxiliary memory circuit, and responding to said write request signal when said first test mode signal is another state by transferring test data immediately from said first auxiliary memory circuit to said main memory circuit;

wherein said auxiliary memory controller sends said main memory controller a status signal, indicating storage of said test data in said auxiliary memory, upon completion of transfer of said test data from said interface circuit to said first auxiliary memory circuit, and when said first test mode signal is in said one state, said main memory controller transfers said test data from said first auxiliary memory circuit to said main memory circuit responsive to said status signal.

17. A method of testing a memory device having a main memory circuit, an auxiliary memory circuit, and an interface circuit, comprising the steps of:

sending address information, a first test mode signal, a read request signal, and a write request signal from external test equipment to said interface circuit;

when said first test mode signal is in a first state, and in response to said write request signal:

transferring test data from said external test equipment to said interface circuit;

storing said test data in said auxiliary memory circuit; and transferring said test data from said auxiliary memory circuit to said main memory circuit; and when said first test mode signal is in a second state, and in response to said write request signal:

transferring test data previously stored in said auxiliary memory circuit to said main memory circuit.

* * * * *